(12) United States Patent
Park et al.

(10) Patent No.: US 10,736,224 B2
(45) Date of Patent: Aug. 4, 2020

(54) HINGE MODULE, CASE AND ELECTRONIC DEVICE HAVING SAME

(71) Applicant: Samsung Electronics Co., Ltd, Suwon-si (KR)

(72) Inventors: Young Sun Park, Yongin-si (KR); Chung Keun Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/068,343

(22) PCT Filed: Nov. 9, 2016

(86) PCT No.: PCT/KR2016/012862
§ 371 (c)(1),
(2) Date: Jul. 5, 2018

(87) PCT Pub. No.: WO2017/119597
PCT Pub. Date: Jul. 13, 2017

(65) Prior Publication Data
US 2019/0029135 A1     Jan. 24, 2019

(30) Foreign Application Priority Data

Jan. 5, 2016   (KR) ........................ 10-2016-0001095

(51) Int. Cl.
*H05K 5/02*         (2006.01)
*H02B 1/38*         (2006.01)
(Continued)

(52) U.S. Cl.
CPC ............. *H05K 5/0226* (2013.01); *E05D 3/06* (2013.01); *E05D 5/10* (2013.01); *E05D 5/14* (2013.01);
(Continued)

(58) Field of Classification Search
None
See application file for complete search history.

(56) References Cited

U.S. PATENT DOCUMENTS 4,489,974 A    12/1984 Warhol
7,114,218 B1   10/2006 Lin
(Continued)

FOREIGN PATENT DOCUMENTS

JP    2003-254323 A    9/2003
JP    2009-068716 A    4/2009
JP    2015-105693 A    6/2015

OTHER PUBLICATIONS

International Search Report dated Feb. 13, 2017 in connection with International Patent Application No. PCT/KR2016/012862.
(Continued)

*Primary Examiner* — Xanthia C Cunningham

(57) ABSTRACT

Disclosed are a hinge module, and a case and an electronic device that include the same. The hinge module includes a first case connection connected to a first case, a second case connection connected to a second case, a first hinge shaft having one end connected to the first case connection, a second hinge shaft having one end connected to the second case connection, and a curling part that provides a frictional force to the first hinge shaft, at least a portion of which is inserted into the curling part, to allow the first hinge shaft to rotate with a first torque and provides a frictional force to the second hinge shaft, at least a portion of which is inserted into the curling part, to allow the second hinge shaft to rotate with a second torque different from the first torque.

17 Claims, 23 Drawing Sheets

(51) Int. Cl.

| | | |
|---|---|---|
| *E05D 11/08* | (2006.01) | |
| *G06F 1/16* | (2006.01) | |
| *H04M 1/02* | (2006.01) | |
| *E05D 3/06* | (2006.01) | |
| *E05D 5/10* | (2006.01) | |
| *E05D 5/14* | (2006.01) | |
| *E05D 11/00* | (2006.01) | |
| *E05D 11/06* | (2006.01) | |
| *H05K 5/00* | (2006.01) | |

(52) U.S. Cl.
CPC .......... *E05D 11/0054* (2013.01); *E05D 11/06* (2013.01); *E05D 11/082* (2013.01); *G06F 1/16* (2013.01); *G06F 1/1615* (2013.01); *G06F 1/1616* (2013.01); *H04M 1/022* (2013.01); *H05K 5/0017* (2013.01); *E05D 2005/102* (2013.01); *E05Y 2201/11* (2013.01); *E05Y 2201/224* (2013.01); *E05Y 2900/606* (2013.01)

(56) References Cited

U.S. PATENT DOCUMENTS

| | | | | |
|---|---|---|---|---|
| 8,738,101 | B1 | 5/2014 | Myr | |
| 9,009,984 | B2 | 4/2015 | Caskey et al. | |
| 9,477,261 | B1* | 10/2016 | Rivera | G06F 1/1613 |
| 2006/0272129 | A1 | 12/2006 | Rude et al. | |
| 2009/0070961 | A1* | 3/2009 | Chung | E05D 3/122 |
| | | | | 16/354 |
| 2011/0157780 | A1* | 6/2011 | Wang | G06F 1/1681 |
| | | | | 361/679.01 |
| 2013/0083467 | A1 | 4/2013 | Becze | |
| 2013/0187525 | A1* | 7/2013 | Chuang | G06F 1/1681 |
| | | | | 312/326 |
| 2013/0322004 | A1* | 12/2013 | Park | F16C 11/10 |
| | | | | 361/679.27 |
| 2015/0189777 | A1* | 7/2015 | Hsu | H05K 5/0226 |
| | | | | 16/366 |
| 2015/0267450 | A1* | 9/2015 | Chiang | G06F 1/1681 |
| | | | | 16/354 |
| 2015/0277505 | A1* | 10/2015 | Lim | G06F 1/1681 |
| | | | | 361/679.27 |
| 2015/0309539 | A1 | 10/2015 | Kamphuis et al. | |
| 2015/0362958 | A1* | 12/2015 | Shang | G06F 1/1681 |
| | | | | 361/679.58 |
| 2016/0011632 | A1* | 1/2016 | Hsu | E05D 3/122 |
| | | | | 16/354 |
| 2016/0060927 | A1* | 3/2016 | Xu | E05D 3/122 |
| | | | | 361/679.55 |
| 2016/0187934 | A1* | 6/2016 | Lee | G06F 1/1618 |
| | | | | 361/679.56 |

OTHER PUBLICATIONS

European Patent Office, "Supplementary European Search Report," Application No. EP16883981.9, dated Dec. 13, 2018, 9 pages.
European Patent Office, "Communication pursuant to Article 94(3) EPC," Application No. EP 16883981.9, dated Nov. 6, 2019, 8 pages.

\* cited by examiner

HINGE MODULE, CASE AND ELECTRONIC DEVICE HAVING SAME

CROSS-REFERENCE TO RELATED APPLICATIONS AND CLAIM OF PRIORITY

This application is a 371 of International Application No. PCT/KR2016/012862 filed on Nov. 9, 2016, which claims priority to Korean Patent Application No. 10-2016-001095 filed on Jan. 5, 2016, in the Korean Intellectual Property Office, the disclosures of which are herein incorporated by reference in their entirety.

BACKGROUND

1. Field

Various embodiments relate to a hinge structure of an electronic device.

2. Description of Related Art

In general, an electronic device may include a case and a cover and may have a structure that covers a front surface thereof. Alternatively, an electronic device may include two or more display devices arranged side by side and may use a hinge structure to connect the display devices. In addition, a foldable mobile phone, a notebook computer, a slate personal computer (PC), or the like also uses a hinge structure.

SUMMARY

However, the electronic devices in the related art have problems in that the thickness in the state in which the display devices or the cases are superimposed on each other is large due to the hinge structures with a large thickness or height and the display devices or the cases rotate (or perform a rotary motion) at only a specified angle.

Various embodiments provide a hinge module, a case and an electronic device including the same. The hinge module allows a plurality of display devices or a plurality of cases to be connected to each other in a hinge structure that allows a relatively slim coupled state and may be easily rotated and maintained at a specified angle.

In accordance with an aspect of the present disclosure, an electronic device includes a first case, a second case, at least one display device mounted on at least one of the first case and the second case, and a hinge module that connects the first case and the second case to allow the first and second cases to rotate. The hinge module includes at least one hinge connected between the first case and the second case so as to be rotatable, and the hinge includes a first case connection connected to the first case, a second case connection connected to the second case, a first hinge shaft having one end connected to the first case connection, a second hinge shaft having one end connected to the second case connection, and a curling part that provides a frictional force to the first hinge shaft, at least a portion of which is inserted into the curling part, to allow the first hinge shaft to rotate with a first torque and provides a frictional force to the second hinge shaft, at least a portion of which is inserted into the curling part, to allow the second hinge shaft to rotate with a second torque different from the first torque.

As described above, according to various embodiments, a plurality of display devices or cases may have a relatively slim coupled state and may be easily arranged and maintained at an angle desired by a user.

Furthermore, according to various embodiments, twisting may be prevented when the display devices or the cases rotate.

In addition, according to various embodiments, signal lines may be easily arranged between the display devices.

DETAILED DESCRIPTION

Figure 1A:
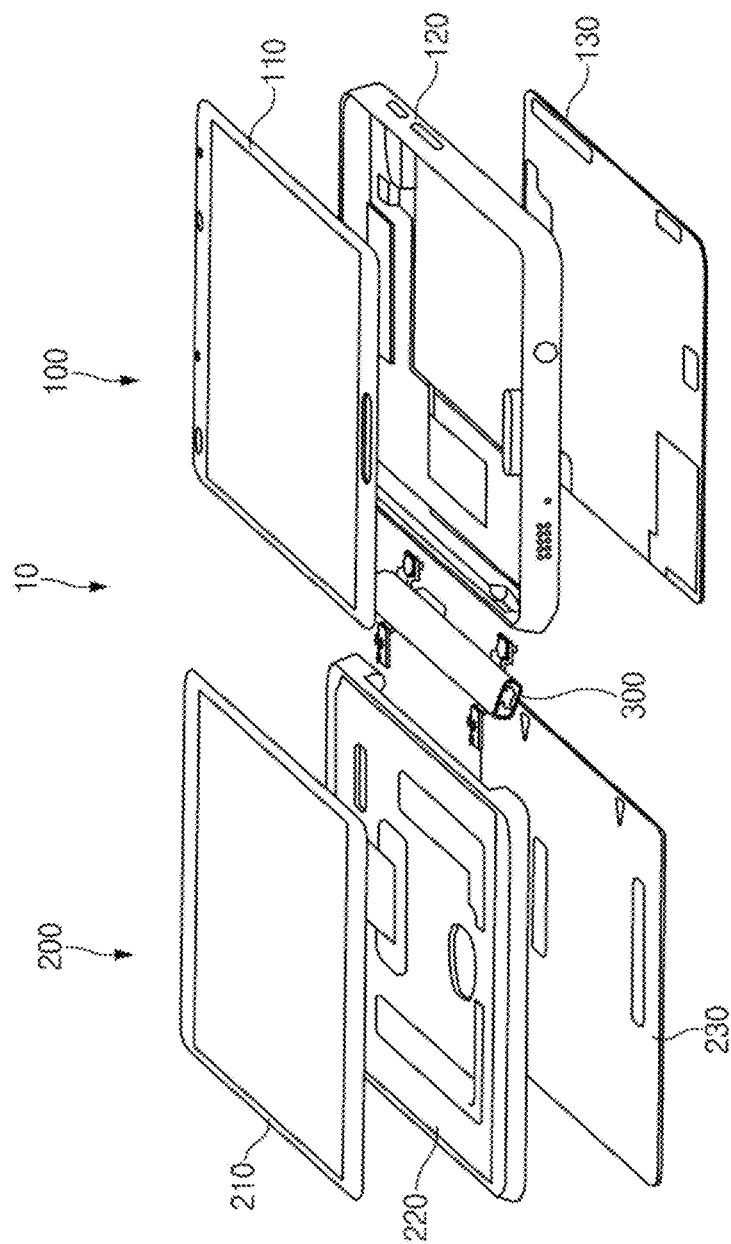
FIG. 1A illustrates an exploded perspective view of an electronic device according to an embodiment.

Various embodiments of the present disclosure may be described with reference to accompanying drawings. Accordingly, those of ordinary skill in the art will recognize that modification, equivalent, and/or alternative on the various embodiments described herein can be variously made without departing from the scope of the present disclosure. With regard to description of drawings, similar elements may be marked by similar reference numerals.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments, but do not limit the elements. Furthermore, such terms may be used to distinguish one element from another element. For example, "a first user device" and "a second user device" may indicate different user devices regardless of the order or priority thereof. For example, "a first user device" and "a second user device" indicate different user devices.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used herein may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. CPU, for example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Terms used in the present disclosure are used to describe specified embodiments and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, e-book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart watches, and the like.

According to another embodiment, the electronic devices may be home appliances. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, or the like.

According to another embodiment, the electronic device may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or internet of things (e.g., light bulbs, various sensors, electric or gas meters, sprinkler devices, fire alarms, thermostats, street lamps, toasters, exercise equipment, hot water tanks, heaters, boilers, and the like).

According to another embodiment, the electronic devices may include at least one of parts of furniture or buildings/structures, electronic boards, electronic signature receiving devices, projectors, or various measuring instruments (e.g., water meters, electricity meters, gas meters, or wave meters, and the like). In the various embodiments, the electronic device may be one of the above-described various devices or a combination thereof. An electronic device according to an embodiment may be a flexible device. Furthermore, an electronic device according to an embodiment may not be limited to the above-described electronic devices and may include other electronic devices and new electronic devices according to the development of technologies.

Hereinafter, an electronic device according to the various embodiments may be described with reference to the accompanying drawings. The term "user" used herein may refer to a person who uses an electronic device or may refer to a device (e.g., an artificial intelligence electronic device) that uses an electronic device.

FIG. 1A illustrates an exploded perspective view of an electronic device according to an embodiment.

Referring to FIG. 1A, an electronic device 10 (e.g., a dual display device) may include a first display device 100, a second display device 200, and a hinge module 300 (or a hinge structure).

The first display device 100 may include a first display module 110, a first case 120, and a first cover 130.

The first case 120 may include the bottom and one or more sidewalls extending vertically or at a predetermined angle from edges of the bottom. At least one of the sidewalls of the first case 120 may have fastening areas where case connections of the hinge module 300 are mounted and fixed. One or more portions of the at least one sidewall may be removed to mount and fix the case connections. Alternatively, the at least one sidewall of the first case 120 may have connection holes into which the case connections of the hinge module 300 are inserted. The case connections of the hinge module 300, which are inserted through the cut-away portions or the connection holes of the sidewall, may be fastened to an edge of the bottom of the first case 120. The first display module 110 may be mounted on an upper surface of the bottom of the first case 120. The first cover 130 may be disposed on a lower surface of the bottom of the first case 120. The first case 120 may be formed of, for example, metal or a material with specified strength that is capable of preventing damage to the first display module 110.

The first display module 110 may include, for example, a display panel for outputting a user interface, display driving modules (e.g., a processor and a memory) for driving the display panel, a battery for supplying power to the display panel and the display driving modules, and the like. The first display module 110 may have a size and a shape similar to those of the bottom of the first case 120 and may be mounted on the first case 120 such that at least a portion of the first display module 110 is surrounded by the first case 120. The first display module 110 may be implemented in a touch screen form and may support an input function. The first display module 110, when mounted on the first case 120, may be disposed to cover the case connections fastened to a side of the bottom of the first case 120. Accordingly, at least a portion of the case connections of the hinge module 300 may not be exposed to the outside, with the first display module 110 coupled to the first case 120.

The first cover 130 may be disposed to cover the lower surface of the bottom of the first case 120. The first cover 130 may be secured to the first case 120 to cover a surface where the battery is disposed. According to various embodiments, the first case 120 and the first cover 130 of the first display device 100 may be integrally formed with each other. In this case, the first cover 130 may be omitted from the first display device 100.

The second display device 200 may include a second display module 210, a second case 220, and a second cover 230, similarly to the first display device 100. Alternatively, the second display module 210 of the second display device 200 may not include a separate display driving module and may include only a display panel. The second display module 210 may operate depending on an operation of the display driving modules in the first display device 100. Also, the second display module 210 may be powered by the battery in the first display device 100. According to various embodiments, the second display module 210 may include a driving module and a battery, similarly to the first display module 110. The second display module 210 may be disposed on the top of the second case 220.

The second case 220 may surround at least some edges of the second display module 210 mounted thereon. Signal lines or signal wiring for driving the second display module 210 may be disposed on at least one of a front surface, a rear surface, and side surfaces of the second case 220. The signal lines may be connected to the first display device 100 through the hinge module 300. The second case 220 may have, on the rear surface thereof, a recessed central portion in which the second cover 230 is mounted. The second display module 210 may be disposed on the front surface of the second case 220, and case connections of the hinge module 300 may be mounted on and fixed to the rear surface (e.g., an edge of the rear surface) of the second case 220.

The second cover 230 may be disposed on the rear surface of the second case 220. At least a portion of the case connections of the hinge module 300, which are mounted on and fixed to the rear surface of the second case 220, may be hidden by the second cover 230, which is fixed to the rear surface of the second case 220, so as not to be exposed to the outside.

The hinge module 300 may connect the first display device 100 and the second display device 200 and may allow the first display device 100 or the second display device 200 to rotate at a predetermined angle in response to external pressure applied thereto. Furthermore, the hinge module 300 may allow the first display device 100 or the second display device 200 to remain at a specific angle (e.g., free-stop). In this regard, the hinge module 300 may include at least one hinge that is connected to the first display device 100 and the second display device 200. Although FIG. 1A illustrates that two hinges are connected to the first and second display devices 100 and 200, the present disclosure is not limited thereto. The number of hinges may be increased, or a single hinge may be used, depending on a design change or a designer's intent.

While the electronic device 10 is described as a dual display device, the present disclosure is not limited thereto. For example, the electronic device 10 may have one display device and a case structure that covers the display device. Furthermore, the first display device 100 or the second display device 200 in the electronic device 10 may include a display panel on at least one of front and rear surfaces thereof.

Figure 1B:
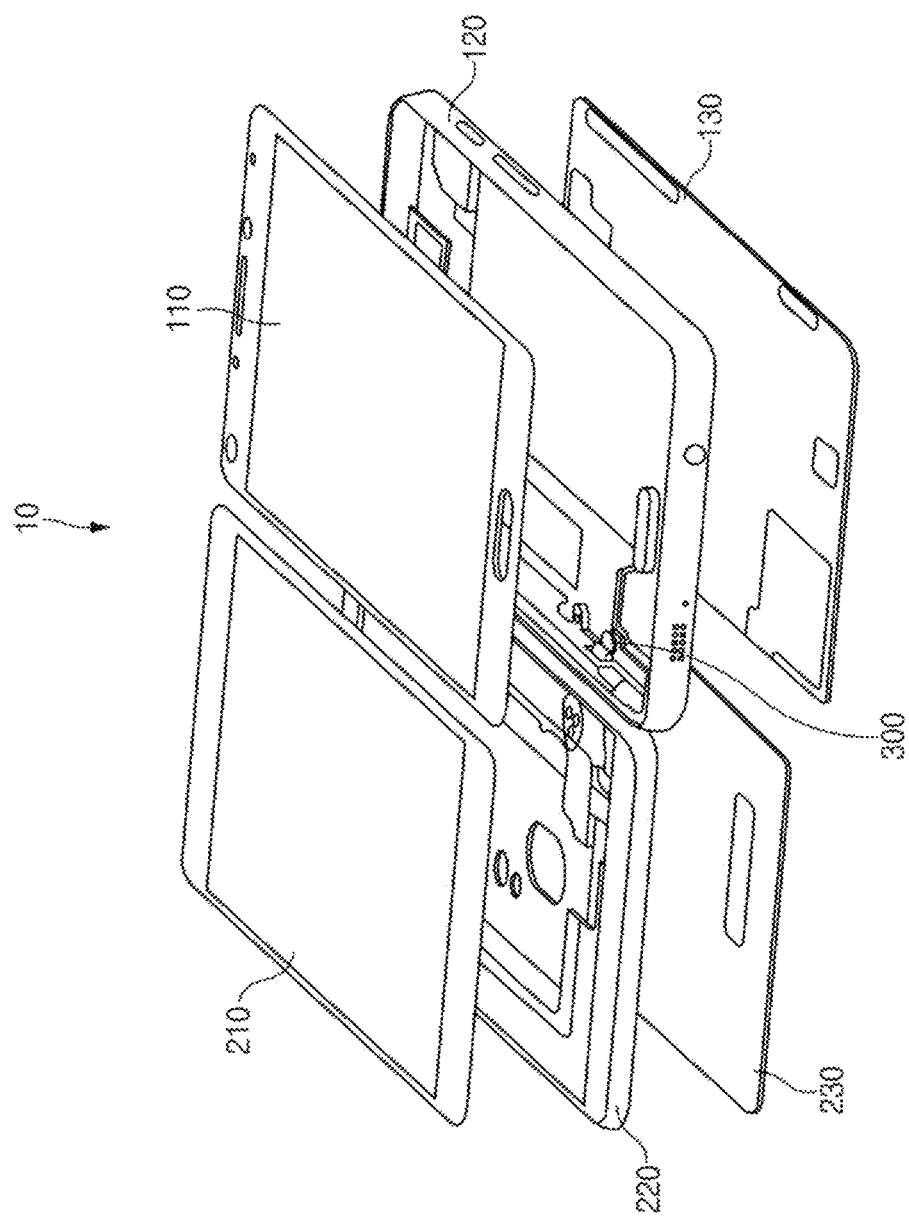
FIG. 1B illustrates a coupled state of a hinge module according to an embodiment of the present disclosure.

FIG. 1B illustrates a coupled state of the hinge module according to an embodiment of the present disclosure.

Referring to FIG. 1B, the case connections of the hinge module 300 may be coupled to the first case 120 and the second case 220 of the electronic device 10 (e.g., a dual display device), as illustrated in the drawing. In this regard, a step of assembling the electronic device 10 may include a step of preparing the first display module 110, the second display module 210, the first case 120, the second case 220, the first cover 130, the second cover 230, and the hinge module 300 and a step of coupling the hinge module 300 to the first case 120 and the second case 220.

In the step of coupling the hinge module 300 to the cases 120 and 220, the hinge module 300 may be coupled to the cases 120 and 220 in any order. As described above, in the state in which the case connections of the hinge module 300 are unfolded toward opposite sides with respect to the center of the hinge module 300, the case connections on a first side may be disposed on the bottom (e.g., the upper surface of the bottom) of the first case 120, and the case connections on a second side may be disposed on the rear surface of the second case 220. The drawing illustrates that the case connections of the hinge module 300 are inserted through connection holes formed in a left sidewall of the first case 120 and then fixed to the bottom of the first case 120. In the case of the second case 220, as illustrated in FIG. 1A, a lower portion of a right sidewall of the second case 220 may be removed, and the case connections may be fixed to a rear surface of the right sidewall of the second case 220.

Figure 1C:
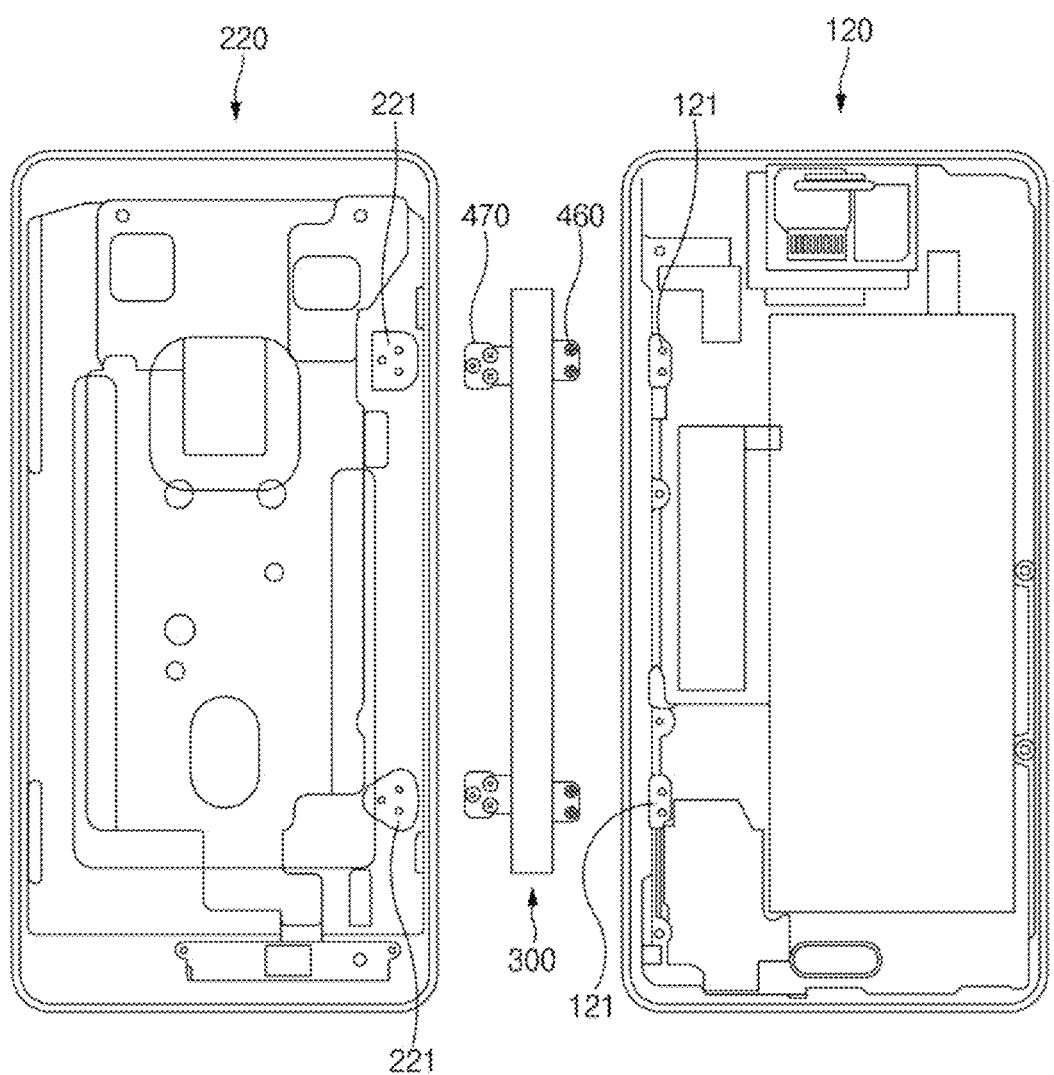
FIG. 1C illustrates a case structure including the hinge module according to an embodiment of the present disclosure.

FIG. 1C illustrates a case structure including the hinge module according to an embodiment of the present disclosure.

Referring to FIG. 1C, the cases 120 and 220 to which the hinge module 300 is coupled may include the first case 120 and the second case 220, as illustrated in the drawing. The above-described first display module 110 may be mounted on a front surface of the first case 120. First hinge coupling parts 121 that are coupled with right case connections 460 of the hinge module 300 may be disposed on a side (e.g., a left edge) of the bottom of the first case 120. The first hinge coupling parts 121 may have an internal female thread formed therein and may be screw-coupled with the right case connections 460. Alternatively, the first hinge coupling parts 121 may have a separate hole or hook structure, in addition to the thread, according to an application of various forms of coupling structures. In another case, the first hinge coupling parts 121 may additionally have a pole fitting structure in connection with the prevention of a movement. Second hinge coupling parts 221 that are coupled with left case connections 470 of the hinge module 300 may be disposed on a side (e.g., a right edge) of the rear surface of the second case 220. Similarly to the first hinge coupling parts 121, the second hinge coupling parts 221 may have an internal female thread formed therein and may be screw-coupled with the left case connections 470. Alternatively, the second hinge coupling parts 221 may have a through-hole formed through the front and rear surfaces of the second case 220 and may be coupled with the left case connections 470 by using a rivet.

As described above, a case according to an embodiment may include a first case, a second case, and a hinge module that connects the first case and the second case to allow the first and second cases to rotate. The hinge module may include at least one hinge connected between the first case and the second case so as to be rotatable, and the hinge may include a first case connection connected to the first case, a second case connection connected to the second case, a first hinge shaft having one end connected to the first case connection, a second hinge shaft having one end connected to the second case connection, and a curling part that provides a frictional force to the first hinge shaft, at least a portion of which is inserted into the curling part, to allow the first hinge shaft to rotate with a first torque and provides a frictional force to the second hinge shaft, at least a portion of which is inserted into the curling part, to allow the second hinge shaft to rotate with a second torque different from the first torque. The first torque may be smaller than the second torque.

According to various embodiments, at least one of a diameter of the first hinge shaft and a shape of a surface of the first hinge shaft inserted into the curling part may be different from at least one of a diameter of the second hinge shaft and a shape of a surface of the second hinge shaft inserted into the curling part, and at least one of a diameter of a first curling hole into which the first hinge shaft is inserted and a shape of an inner wall that forms the first curling hole may be different from at least one of a diameter of a second curling hole into which the second hinge shaft is inserted and a shape of an inner wall that forms the second curling hole.

Figure 1D:
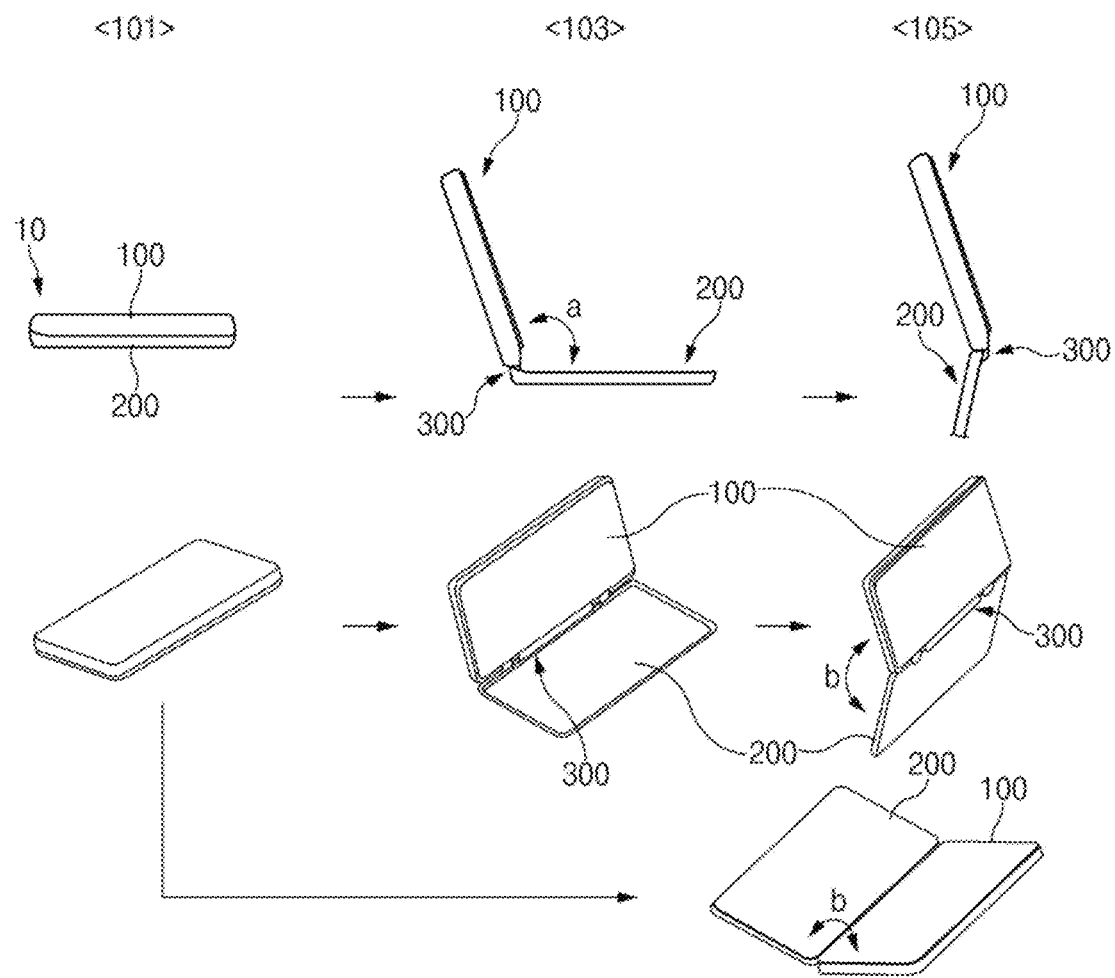
FIG. 1D illustrates states in which first and second display devices are rotated according to an embodiment of the present disclosure.

FIG. 1D illustrates states in which the first and second display devices are rotated according to an embodiment of the present disclosure.

Referring to FIG. 1D, as in a state 101, the hinge module 300 of the electronic device 10 may allow the first display device 100 and the second display device 200 to rotate relative to each other such that a first surface of the first display device 100 and a first surface of the second display device 200 face or make surface-to-surface contact with each other, or are parallel to each other. The first surface of the first display device 100 that faces the first surface of the second display device 200 may be, for example, a rear surface of the first cover 130. Alternatively, a second surface of the first display device 100 that faces the first surface of the second display device 200 may be, for example, a front surface of the first display module 110. In another case, the first surface of the first display device 100 that faces the first surface of the second display device 200 may be, for example, the front surface of the first display module 110. In another case, the second surface of the first display device 100 that faces the first surface of the second display device 200 may be, for example, an outer surface (or a surface exposed to the outside) of the first cover 130.

According to various embodiments, the first surface of the second display device 200 that faces the first surface of the first display device 100 may be, for example, a rear surface of the second cover 230. Alternatively, a second surface of the second display device 200 that faces the first surface of the first display device 100 may be, for example, the rear surface of the second cover 230. In another case, the first surface of the second display device 200 that faces the first surface of the first display device 100 may be, for example, a front surface of the second display module 210. In another case, the second surface of the second display device 200 that faces the first surface of the first display device 100 may be, for example, the front surface of the second display module 210.

According to an embodiment, as in a state 103, the hinge module 300 may allow the first display device 100 (or the second display device 200, the following description being made based on the first display device 100) to rotate relative to the second display device 200 within a specified angle range "a" while external pressure is being applied. Furthermore, as in a state 105, the hinge module 300 may allow the second display device 200 (or the first display device 100, the following description being made based on the second display device 200) to rotate relative to the first display device 100 within a specified angle range of 360 degrees– (b+a) when additional external pressure is applied in the state in which the first display device 100 is rotated to a first specified limit. As described above, in response to the external pressure, the hinge module 300 may allow the first display device 100 to rotate before the second display device 200 and may allow the second display device 200 to rotate after the first display device 100 is rotated to the specified limit. Accordingly, the hinge module 300 may suppress twisting caused by non-uniform rotation of the first and second display devices 100 and 200 while the two devices are being rotated by the external pressure. When external pressure is applied to change the first display device 100 from the state 105 to the state 101, the corresponding external pressure may be used to rotate a first hinge shaft to allow the first display device 100 to rotate by the specified limit angle range and may then be used to rotate a second hinge shaft.

In the state 101, the first display module 110 of the first display device 100 may be disposed on a front side of the electronic device 10, and the second display module 210 of the second display device 200 may be disposed on a rear side of the electronic device 10 (the first display module 110 and the second display module 210 may be opposite to each other). In this case, the hinge module 300 may have a limit rotation range of a specified angle "b" (e.g., 120 degrees to 170 degrees, or 150 degrees or less) when the first display module 110 and the second display module 210 rotate in a first direction (e.g., the first display module 110 and the second display module 210 rotate to face each other). Alternatively, the hinge module 300 may allow the first display device 100 and the second display device 200 to rotate within a specified angle range (e.g., 0 degrees to 210 degrees or more) when the first display device 100 and the second display device 200 rotate in a second direction (e.g., the first cover 130 and the second cover 230 rotate to face each other). The hinge module 300 may be rotated such that the rear surface of the first cover 130 and the rear surface of the second cover 230 make surface-to-surface contact with, or are parallel to, each other when the first and second display devices 100 and 200 of the electronic device 10 (e.g., a dual display device) rotate in the second direction. The hinge module 300 may be disposed (or formed, or configured) such that specified torque is applied to the hinge shafts, and therefore the first display device 100 and the second display device 200 may be maintained at a specific angle within a specified angle range.

As described above, an electronic device according to an embodiment may include a first case, a second case, at least one display device mounted on at least one of the first case and the second case, and a hinge module that connects the first case and the second case to allow the first and second cases to rotate. The hinge module may include at least one hinge connected between the first case and the second case so as to be rotatable, and the hinge may include a first case connection connected to the first case, a second case connection connected to the second case, a first hinge shaft having one end connected to the first case connection, a second hinge shaft having one end connected to the second case connection, and a curling part that provides a frictional force to the first hinge shaft, at least a portion of which is inserted into the curling part, to allow the first hinge shaft to rotate with a first torque and provides a frictional force to the second hinge shaft, at least a portion of which is inserted into the curling part, to allow the second hinge shaft to rotate with a second torque different from the first torque. For example, the first torque may be smaller in magnitude than the second torque.

According to various embodiments, the electronic device may further include a stopping member into which at least a portion of the first hinge shaft and at least a portion of the second hinge shaft are inserted. The stopping member may include a first stopper allowing a first case stopping member formed on the first case connection to rotate in a first angle range, a second stopper allowing a second case stopping member formed on the second case connection to rotate in a second angle range, and a stopping member body on which the first stopper and the second stopper are disposed. The first angle range may be the same as, or different from, the second angle range.

According to various embodiments, at least one of a diameter of the first hinge shaft and a shape of a surface of the first hinge shaft inserted into the curling part may be different from at least one of a diameter of the second hinge shaft and a shape of a surface of the second hinge shaft inserted into the curling part, and at least one of a diameter of a first curling hole into which the first hinge shaft is inserted and a shape of an inner wall that forms the first curling hole may be different from at least one of a diameter of a second curling hole into which the second hinge shaft is inserted and a shape of an inner wall that forms the second curling hole.

According to various embodiments, the first hinge shaft may have a first diameter larger than a diameter of a first curling hole formed in the curling part, and the second hinge shaft may have a second diameter larger than the first diameter.

According to various embodiments, the first hinge shaft may include a first rotary friction part mounted in the curling part and including a strap-shaped protrusion with a first width, and the second hinge shaft may include a second rotary friction part including a strap-shaped protrusion with a second width different from the first width. For example, the strap-shaped protrusion with the first width may be narrower than the strap-shaped protrusion with the second width.

According to various embodiments, the number of strap-shaped protrusions with the second width on the second rotary friction part may be the same as, or different from, the number of strap-shaped protrusions with the first width on the first rotary friction part. For example, the number of strap-shaped protrusions with the first width may be smaller than the number of strap-shaped protrusions with the second width.

According to various embodiments, the first hinge shaft may include a first rotary friction part mounted in the curling part and including a rail groove with a first width that is formed in an axial direction of the first hinge shaft, and the second hinge shaft may include a second rotary friction part including a rail groove with a second width different from the first width. For example, the rail groove with the first width may be wider than the rail groove with the second width.

According to various embodiments, the number of rail grooves with the second width on the second rotary friction part may be the same as, or different from, the number of rail grooves with the first width on the first rotary friction part. For example, the number of rail grooves with the first width may be larger than the number of rail grooves with the second width.

According to various embodiments, the first hinge shaft may include a first rotary friction part mounted in the curling part and having at least one first grid protrusion formed by at least one lateral strap-shaped groove and at least one longitudinal rail groove, and the second hinge shaft may include a second rotary friction part mounted in the curling part and having at least one second grid protrusion formed by at least one lateral strap-shaped groove and at least one longitudinal rail groove and having a different shape from the first grid protrusion. For example, the surface area of the first grid protrusion may be smaller than the surface area of the second grid protrusion. Alternatively, the number of first grid protrusions may be smaller than the number of second grid protrusions.

According to various embodiments, the curling part may include a first curling part into which the first hinge shaft is inserted and in which a first curling hole with a first diameter is formed, a second curling part into which the second hinge shaft is inserted and in which a second curling hole with a second diameter different from the first diameter is formed, and a curling part body that connects the first curling part and the second curling part. For example, the first diameter of the first curling hole may be smaller than the second diameter of the second curling hole.

According to various embodiments, the curling part may include a first curling part into which the first hinge shaft with a first diameter is inserted and in which a first curling hole with a specified diameter is formed, a second curling part into which the second hinge shaft with a second diameter different from the first diameter is inserted and in which a second curling hole with the specified diameter is formed, and a curling part body that connects the first curling part and the second curling part. For example, the first diameter of the first hinge shaft may be larger than the second diameter of the second hinge shaft.

According to various embodiments, the curling part may include a first curling part into which the first hinge shaft is inserted and in which a first curling hole with a first diameter is formed, a second curling part into which the second hinge shaft with the same diameter as the first hinge shaft is inserted and in which a second curling hole with a second diameter different from the first diameter is formed, and a curling part body that connects the first curling part and the second curling part. For example, the first diameter of the first curling hole may be larger than the second diameter of the second curling hole.

According to various embodiments, the curling part may include a first curling part into which the first hinge shaft is inserted and that has a first number of strap-shaped grooves with a first width on an inner wall of the first curling part, a second curling part into which the second hinge shaft is inserted and that has a second number of strap-shaped grooves with a second width on an inner wall of the second curling part, and a curling part body that connects the first curling part and the second curling part. For example, the first width of the strap-shaped groove of the first curling part may be larger than the second width of the strap-shaped groove of the second curling part, and the first number of strap-shaped grooves of the first curling part may be larger than the second number of strap-shaped grooves of the second curling part.

According to various embodiments, the curling part may include a first curling part into which the first hinge shaft is inserted and that has a first number of rail grooves with a first width that are formed on an inner wall of the first curling part in a longitudinal direction, a second curling part into which the second hinge shaft is inserted and that has a second number of rail grooves with a second width, and a curling part body that connects the first curling part and the second curling part. For example, the rail grooves with the first width may be wider than the rail grooves with the second width, and the number of rail grooves with the first width may be larger than the number of rail grooves with the second width.

According to various embodiments, the curling part may include a first curling part into which the first hinge shaft is inserted and that includes, on an inner wall, a first number of longitudinal rail grooves with a first width and a second number of lateral strap-shaped grooves with a second width, a second curling part into which the second hinge shaft is inserted and that includes, on an inner wall, a third number of longitudinal rail grooves with a third width and a fourth number of lateral strap-shaped grooves with a fourth width, and a curling part body that connects the first curling part and the second curling part. The first width may be larger than the third width, and the second width may be larger than the fourth width. The first number may be larger than the third number, and the second number may be larger than the fourth number.

According to various embodiments, the electronic device may further include at least one of a shaft fixing part that fixes an axial movement of the first hinge shaft and the second hinge shaft, a hinge dummy to which the hinge module is fixed, and a hinge cover disposed to cover the hinge dummy to which the hinge module is fixed.

Figure 1E:
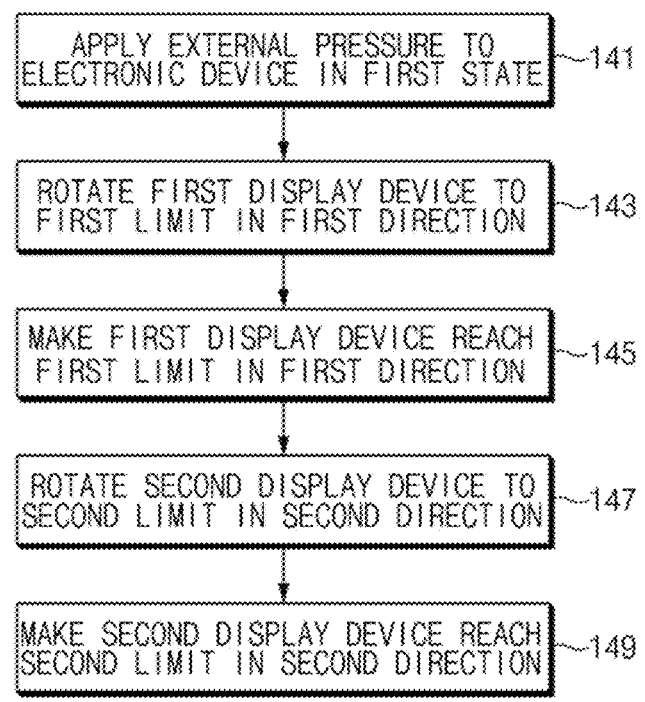
FIG. 1E illustrates a first hinge operation of the electronic device according to an embodiment of the present disclosure.

FIG. 1E illustrates a first hinge operation of the electronic device according to an embodiment of the present disclosure.

Referring to FIG. 1E, in regard to the first hinge operation of the electronic device 10, in operation 141, external pressure may be applied to the electronic device 10 in a first state. For example, the first state of the electronic device 10 may include a state in which the rear surface of the first display device 100 and the rear surface of the second display device 200 are arranged parallel to each other. The external pressure may be applied to increase the angle between the rear surface of the first display device 100 and the rear surface of the second display device 200.

In operation 143, the first display device 100 of the electronic device 10 may be rotated by the applied external pressure in a first direction (e.g., a direction in which the angle between the rear surface of the first display device 100 and the rear surface of the second display device 200 increases). In operation 145, the rotation of the first display device 100 may be stopped at a first limit when the external pressure continues to be applied.

In operation 147, the second display device 200 may be rotated in a second direction (a direction in which the angle between the rear surface of the first display device 100 and the rear surface of the second display device 200 increases) when the external pressure continues to be applied.

In operation 149, the rotation of the second display device 200 may be stopped at a second limit when the external pressure continues to be applied. Therefore, the first display device 100 and the second display device 200 may be maintained at a specified angle (e.g., 150 degrees). Correspondingly, an edge of the first display module 110 of the first display device 100 and an edge of the second display module 210 may make contact with each other.

Figure 1F:
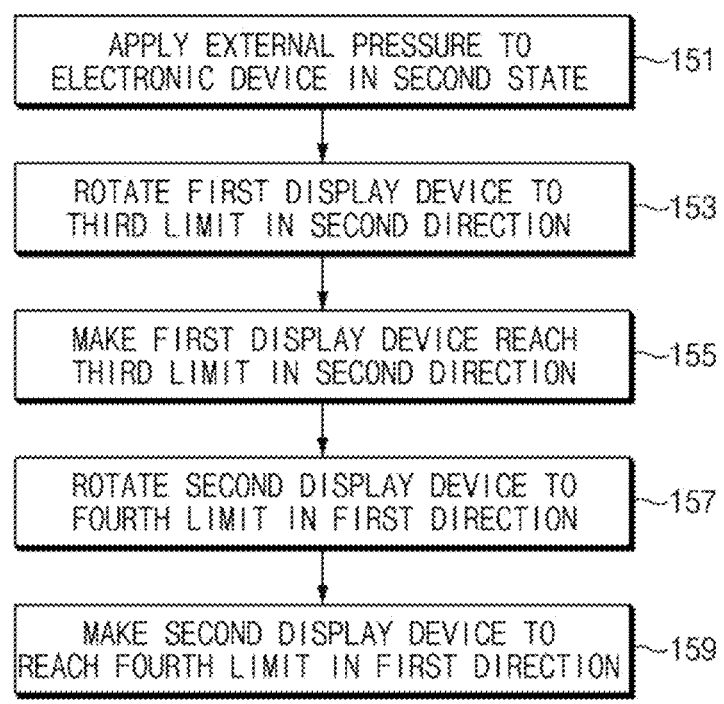
FIG. 1F illustrates a second hinge operation of the electronic device according to an embodiment of the present disclosure.

FIG. 1F illustrates a second hinge operation of the electronic device according to an embodiment of the present disclosure.

Referring to FIG. 1F, in regard to the second hinge operation of the electronic device 10, in operation 151, external pressure may be applied to the electronic device 10 in a second state. For example, the second state of the electronic device 10 may include a state in which an edge of the first display module 110 and an edge of the second display module 210 make contact with each other. The external pressure may be applied to decrease the angle between the rear surface of the first display device 100 and the rear surface of the second display device 200 or to make the rear surface of the first display device 100 and the rear surface of the second display device 200 parallel to each other.

In operation 153, the first display device 100 of the electronic device 10 may be rotated by the applied external pressure in a second direction (e.g., a direction in which the angle between the front surface of the first display module 110 and the front surface of the second display module 210 increases). In operation 155, the rotation of the first display device 100 may be stopped at a third limit when the external pressure continues to be applied.

In operation 157, the second display device 200 may be rotated in a first direction (a direction in which the angle between the rear surface of the first display device 100 and the rear surface of the second display device 200 decreases) when the external pressure continues to be applied.

In operation 159, the rotation of the second display device 200 may be stopped at a fourth limit when the external pressure continues to be applied. Therefore, the first display device 100 and the second display device 200 may be maintained at a specified angle (e.g., 0 degrees). Correspondingly, the rear surface of the first display device 100 and the rear surface of the second display device 200 may be arranged parallel to each other.

In FIGS. 1E and 1F, the first limit may be, for example, 102 degrees (or 108 degrees), and the second limit may be, for example, 108 degrees (or 102 degrees). Furthermore, the third limit may be, for example, 0 degrees, and the fourth limit may be, for example, 0 degrees. The above-described limits may be determined based on a limit range (e.g., 0 degrees to 102 degrees) in which the first display device 100 is movable and a limit range (e.g., 0 degrees to 108 degrees) in which the second display device 200 is movable. Therefore, the limits described above with reference to FIGS. 1E and 1F may be changed in the case where the limit ranges of the first and second display devices 100 and 200 are designed to be changed.

As described above, when the external pressure is applied to the electronic device 10 in the first state according to an embodiment of the present disclosure, the first display device 100 operating with a first torque may rotate to the first limit, and then the second display device 200 operating with a second torque (e.g., the second torque being greater than the first torque) may rotate to the second limit. Alternatively, when the external pressure is applied to the electronic device 10 in the second state, the first display device 100 operating with the first torque may rotate to the third limit, and then the second display device 200 operating with the second torque may rotate to the fourth limit. According to various embodiments, when the direction of the external pressure applied to the electronic device 10 is changed from the first direction to the second direction (e.g., a direction opposite to the first direction) before the first limit, the first display device 100 may rotate within a first range (the first limit range to the third limit range) without rotation of the second display device 200. In the state in which the first display device 100 is rotated to the first limit, the second display device 200 may rotate when external pressure is applied in the first direction, and the first display device 100 may rotate in the second direction to reach the third limit when external pressure is applied in the second direction. The second display device 200 may be rotated within a specified range by external pressure in the state in which the first display device 100 is rotated to the first or third limit.

An electronic device according to an embodiment may include a first display device, a second display device, and a hinge module to which the first display device and the second display device are connected so as to be rotatable. The hinge module may include a first hinge shaft to which the first display device is connected so as to be rotatable within a first range and a second hinge shaft to which the second display device is connected so as to be rotatable within a second range. The first hinge shaft to which a first torque is applied may rotate within the first range before the second hinge shaft when external pressure is applied, and the second hinge shaft to which a second torque larger than the first torque is applied may rotate within the second range after the first hinge shaft when the first hinge shaft reaches a limit of the first range.

A hinge module according to an embodiment may include a first case connection connected to a first case, a second case connection connected to a second case, a first hinge shaft having one end connected to the first case connection, and a second hinge shaft having one end connected to the second case connection. The first hinge shaft to which a first torque is applied may rotate within a first range before the second hinge shaft when external pressure is applied, and the second hinge shaft to which a second torque larger than the first torque is applied may rotate within a second range after the first hinge shaft when the first hinge shaft reaches a limit of the first range.

Figure 2:
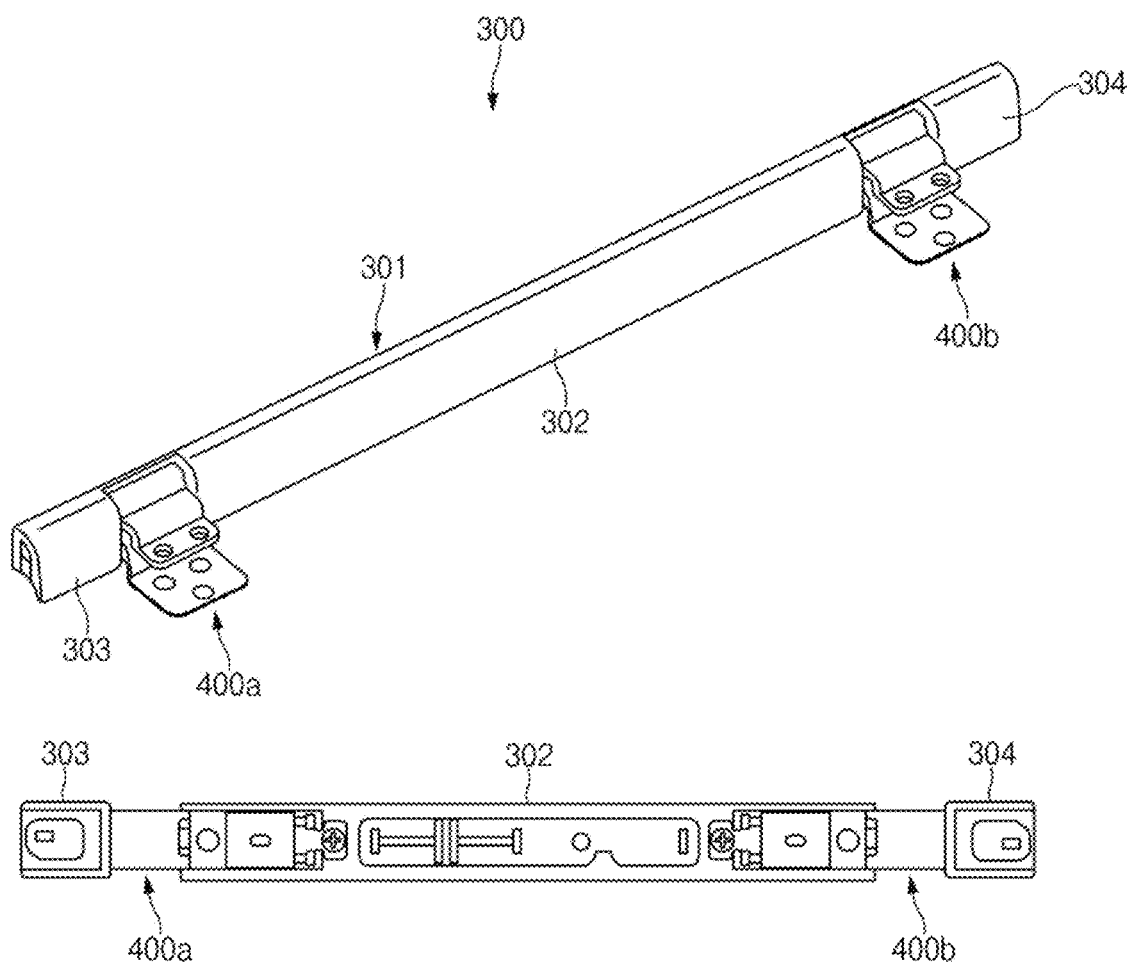
FIG. 2 illustrates the hinge module according to an embodiment of the present disclosure.

FIG. 2 illustrates the hinge module according to an embodiment of the present disclosure.

Referring to FIG. 2, the hinge module 300 of the present disclosure may include a first hinge dummy 301, a second hinge dummy 302, a third hinge dummy 303, a fourth hinge dummy 304, a first hinge 400a, and a second hinge 400b. As mentioned above, according to various embodiments, the hinge module 300 may include two or more hinges, or may include a single hinge. The number of hinge dummies may be increased in the case where the hinge module 300 includes three or more hinges and may be decreased in the case where the hinge module 300 includes a single hinge.

The first hinge 400a and the second hinge 400b may be coupled, at one side thereof, to an inner wall of the second hinge dummy 302. The case connections 460 and 470 of the first hinge 400a and the case connections 460 and 470 of the second hinge 400b may be exposed to the outside through between the second hinge dummy 302 and the third hinge dummy 303 and through between the second hinge dummy 302 and the fourth hinge dummy 304. The case connections 460 and 470 of the first hinge 400a may rotate within a specified angle range to face each other, to face the horizontal direction, or to be opposite to each other.

The second hinge dummy 302 may be shorter than the first hinge dummy 301. The second hinge dummy 302 may be wider than the hinges 400a and 400b. The second hinge dummy 302 may have one or more coupling structures (e.g., threaded recesses) therein to which the hinges 400a and 400b are coupled. The second hinge dummy 302 may have a coupling structure (e.g., a hook recess or a hook) therein to which the first hinge dummy 301 is coupled. The second hinge dummy 302 may have the same width as the first hinge dummy 301. The second hinge dummy 302 may have at least one bent or curved portion on which the hinges 400a and 400b are mounted.

The third hinge dummy 303 may include a coupling structure, for example, a hook structure coupled with a hook (or a hook recess) formed on the first hinge dummy 301. Similarly, the fourth hinge dummy 304 may include a coupling structure, for example, a hook structure coupled with a hook (or a hook recess) formed on the first hinge dummy 301.

At least a portion of the second hinge dummy 302, the third hinge dummy 303, the fourth hinge dummy 304, and the case connections 460 and 470 may be exposed to the outside in the state in which the first display device 100 and the second display device 200 are rotated at a specified angle. The at least a portion of the second hinge dummy 302, the third hinge dummy 303, the fourth hinge dummy 304, and the case connections 460 and 470 may not be exposed to the outside when the first display device 100 and the second display device 200 are superimposed on each other.

The length of the first hinge dummy 301 may be the same as, or similar to, the sum of lengths of the second hinge dummy 302, the third hinge dummy 303, the fourth hinge dummy 304, and the case connections 460 and 470. The first hinge dummy 301 may be disposed to cover open areas of the second to fourth hinge dummies 302, 303, and 304 to which the hinges 400a and 400b are coupled. The first hinge dummy 301 may be hook-coupled with the second hinge dummy 302, the third hinge dummy 303, and the fourth hinge dummy 304 through one or more hook structures disposed on the inside thereof. An outer surface of the first hinge dummy 301 may be exposed to the outside when the first display device 100 and the second display device 200 are superimposed on each other. The first hinge dummy 301 may not be exposed to the outside when the first display device 100 and the second display device 200 are arranged at a specified angle (e.g., 150 degrees). For example, when an edge of a side surface of the first display device 100 and an edge of a side surface of the second display device 200 are arranged to be substantially or nearly in contact, at least a portion of the first hinge dummy 301 may be hidden by the first and second display devices 100 and 200.

As described above, a hinge module according to an embodiment may include a first case connection connected to a first case, a second case connection connected to a second case, a first hinge shaft having one end connected to the first case connection, a second hinge shaft having one end connected to the second case connection, and a curling part that provides a frictional force to the first hinge shaft, at least a portion of which is inserted into the curling part, to allow the first hinge shaft to rotate with a first torque and provides a frictional force to the second hinge shaft, at least a portion of which is inserted into the curling part, to allow the second hinge shaft to rotate with a second torque different from the first torque. According to an embodiment, the first torque may be smaller in magnitude than the second torque.

According to various embodiments, at least one of a diameter of the first hinge shaft and a shape of a surface of the first hinge shaft inserted into the curling part may be different from at least one of a diameter of the second hinge shaft and a shape of a surface of the second hinge shaft inserted into the curling part, and at least one of a diameter of a first curling hole into which the first hinge shaft is inserted and a shape of an inner wall that forms the first curling hole may be different from at least one of a diameter of a second curling hole into which the second hinge shaft is inserted and a shape of an inner wall that forms the second curling hole.

Figure 3:
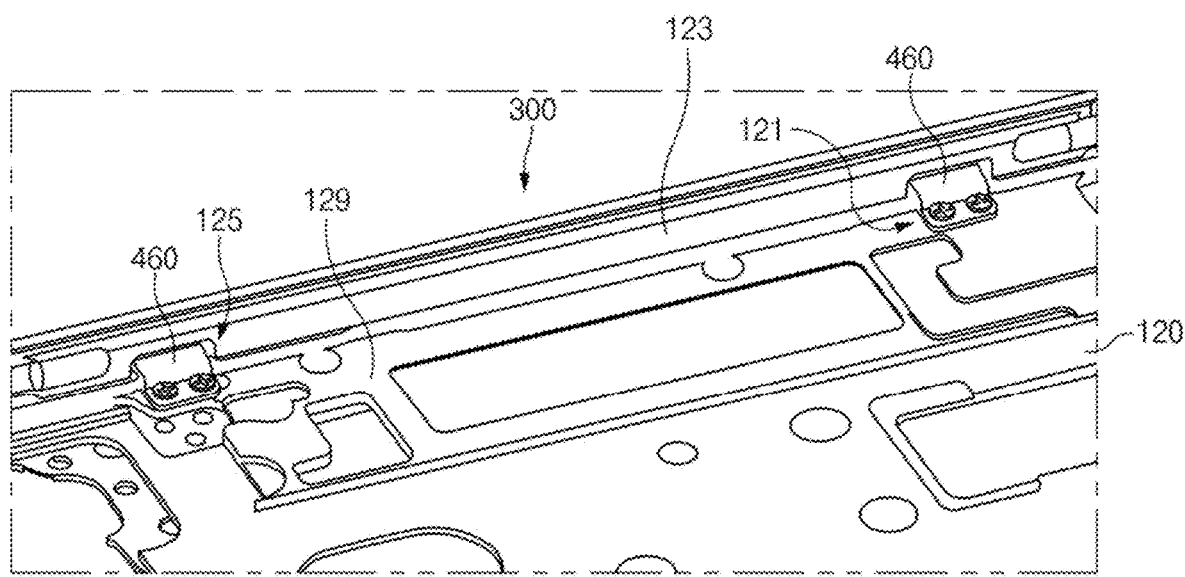
FIG. 3 illustrates a state in which the hinge module is connected to a first case according to an embodiment of the present disclosure.

FIG. 3 illustrates a state in which the hinge module is connected to the first case according to an embodiment of the present disclosure.

Referring to FIG. 3, as described above, the first case 120 may include a first bottom 129, a first sidewall 123, connection holes 125, and the first hinge coupling parts 121. Additionally or alternatively, the display driving modules, the battery, and the like that are required to drive the first display module 110 may be mounted on the first case 120.

The first bottom 129 may face a rear surface of the first display module 110. The first bottom 129 may support the first display module 110 mounted thereon, and various modules required to drive the first display module 110 may be mounted on the first bottom 129. At least a part of signal wiring required to drive the second display module 210 may be disposed on a side of the first bottom 129.

The first sidewall 123 may extend upward from an edge of the first bottom 129 at a predetermined angle. The inside of the first sidewall 123 may cover an edge of the first display module 110 mounted on the first bottom 129. The outside of the first sidewall 123 may face the hinge dummies 301 to 304 of the hinge module 300. At least some areas of the first sidewall 123 may be removed to form the connection holes 125.

The connection holes 125 may be formed through front and rear surfaces of the areas of the first sidewall 123. For example, the size of the connection holes 125 may be the same as, or similar to (e.g., larger than), the width of the first case connections 460.

The first hinge coupling parts 121 may be provided on the first bottom 129 so as to be adjacent to the first sidewall 123 through which the connection holes 125 are formed. The first hinge coupling parts 121 may be aligned with holes formed in the first case connections 460 and may then be coupled with the first case connections 460. For example, the first hinge coupling parts 121 may have a threaded structure to which a screw is coupled. According to various embodiments, the first hinge coupling parts 121 may be coupled with the first case connections 460 through rivets.

Figure 4:
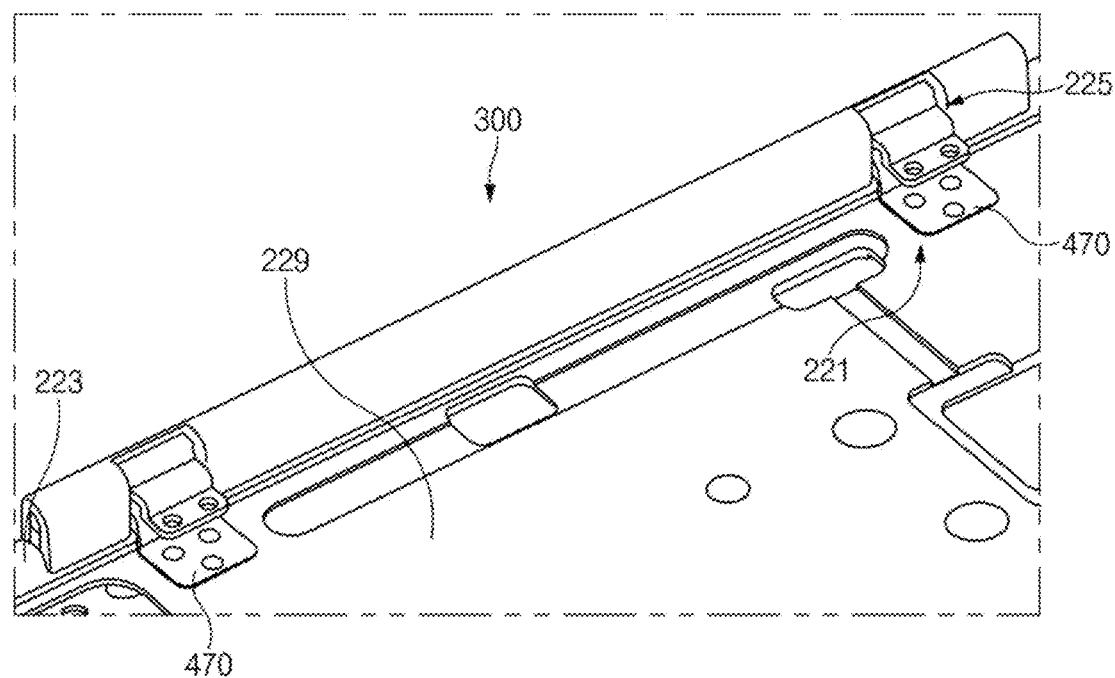
FIG. 4 illustrates a state in which the hinge module is connected to a second case according to an embodiment of the present disclosure.

FIG. 4 illustrates a state in which the hinge module is connected to the second case according to an embodiment of the present disclosure.

Referring to FIG. 4, as described above, the second case 220 may include a second bottom 229, a second sidewall 223, a connection groove 225, and the second hinge coupling parts 221. Additionally or alternatively, signal wiring required to drive the second display module 210 may be disposed on a surface of the second case 220.

For example, the second display module 210 or the second cover 230 may be mounted on the second bottom 229. The second cover 230 may be mounted on the second bottom 229 on which the second hinge coupling parts 221 are disposed. The signal wiring associated with driving the second display module 210 may be disposed on the second bottom 229. The signal wiring may be connected to the first display device 100.

The second sidewall 223 may be provided at an edge of the second bottom 229. At least a portion of the second sidewall 223 may be removed to form the connection groove 225. The connection groove 225 may be formed by the area where the second sidewall 223 is removed and the second bottom 229. The connection groove 225 may be used to mount the second case connections 470 of the hinge module 300.

The second hinge coupling parts 221 may be formed in areas of the second bottom 229 that are adjacent to the second sidewall 223. For example, the second hinge coupling parts 221 may have a shape corresponding to the shape of the second case connections 470. According to an embodiment, the second hinge coupling parts 221 may be engraved on the second bottom 229 to a specified depth. The second hinge coupling parts 221 may include, for example, at least one recess or hole. The at least one recess or hole formed in the second hinge coupling parts 221 may be aligned with holes formed in the second case connections 470. The second hinge coupling parts 221 may be coupled with the second case connections 470 through screws or rivets.

Figure 5:
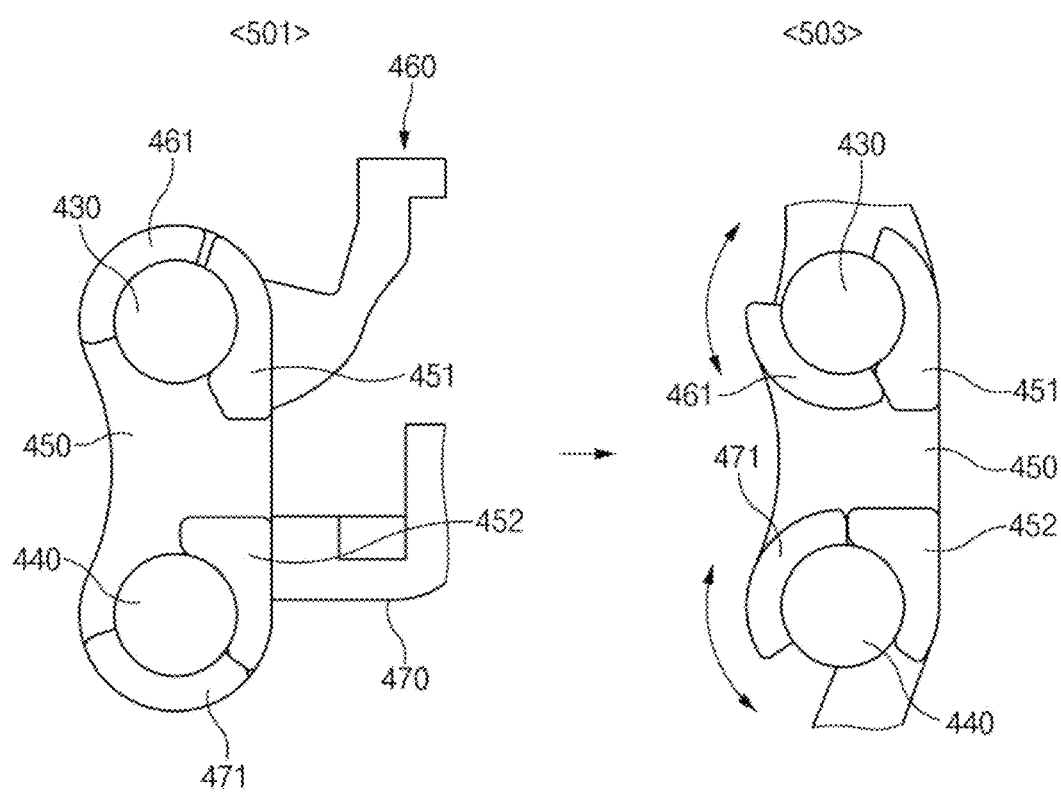
FIG. 5 illustrates a rotation limit range of the hinge module according to an embodiment of the present disclosure.

FIG. 5 illustrates a rotation limit range of the hinge module according to an embodiment of the present disclosure.

Referring to FIG. 5, as described above, a hinge 400 (e.g., the first hinge 400a or the second hinge 400b) may include the first case connection 460 connected to the first case 120 and the second case connection 470 connected to the second case 220. Furthermore, the hinge 400 may include a stopping member 450 on which the first case connection 460 and the second case connection 470 are mounted.

As in a state 501, the stopping member 450 may include, on upper and lower sides thereof, holes having a predetermined length and width through which a first hinge shaft 430 and a second hinge shaft 440 pass. The stopping member 450 may include a first stopper 451 disposed on the upper side thereof and a second stopper 452 disposed on the lower side thereof. The first stopper 451 may protrude a predetermined height from a side surface of the stopping member 450 in the direction in which the first hinge shaft 430 passes through the stopping member 450 and may surround the periphery of the hole through which the first hinge shaft 430 passes. Furthermore, the first stopper 451 may face a portion of the first hinge shaft 430. Similarly to the first stopper 451, the second stopper 452 may protrude a predetermined height from the side surface of the stopping member 450 in the direction in which the second hinge shaft 440 passes through the stopping member 450. The second stopper 452 may surround a partial area of the second hinge shaft 440.

When external pressure is applied to rotate the first case connection 460, a first case stopping member 461 protruding from a lateral portion of the first case connection 460 may rotate along a surface of the first hinge shaft 430. In this operation, while rotating along the surface of the first hinge shaft 430, the first case stopping member 461 may make contact with one of opposite sides of the first stopper 451 to have a rotation limit range (e.g., a first direction limit range and a second direction limit range, or a clockwise direction limit range and a counterclockwise direction limit range). For example, as in the state 501, a first end of the first case stopping member 461 may be stopped by an upper end of the first stopper 451 and may no longer be rotated, and as in a state 503, a second end of the first case stopping member 461 may be stopped by a lower end of the first stopper 451 and may no longer be rotated. As in the states 501 and 503, the range in which the first case connection 460 is rotatable may have a first angle range (e.g., a range of 102 degrees) specified by the first stopper 451 and the first case stopping member 461.

When external pressure is applied to the second case connection 470 or the second display device 200 to which the second case connection 470 is connected, a second case stopping member 471 protruding from a lateral portion of the second case connection 470 may rotate along a surface of the second hinge shaft 440. In this operation, the second case stopping member 471 may make contact with one of opposite sides of the second stopper 452 and may have a rotation limit range. For example, as in the state 501, a first end of the second case stopping member 471 may be stopped by a lower end of the second stopper 452 and may no longer be rotated, and as in the state 503, a second end of the second case stopping member 471 may be stopped by an upper end of the second stopper 452 and may no longer be rotated. As in the states 501 and 503, the range in which the second case connection 470 is rotatable may have a second angle range (e.g., a range of 108 degrees) specified by the second stopper 452 and the second case stopping member 471.

The radius of rotation of the first case connection 460 and the radius of rotation of the second case connection 470 may vary depending on the shape of the first stopper 451 and the second stopper 452. The shape of the first stopper 451 and the shape of the second stopper 452 may vary depending on a design range of the angle between the first display device 100 and the second display device 200. The illustrated drawing may correspond to a case where a limit range of the angle between the first display device 100 and the second display device 200 is designed to be 105 degrees. Even though the limit range is set to be 105 degrees, the first stopper 451 and the second stopper 452 may have the same shape (e.g., may be formed to have a limit range of 105 degrees). Alternatively, the first stopper 451 may be formed to have a limit range of 108 degrees, and the second stopper 452 may be formed to have a limit range of 102 degrees. Accordingly, the shape of the first stopper 451 and the shape of the second stopper 452 may be designed to have a limit range of various angles (e.g., 130 degrees, 140 degrees, 160 degrees, 170 degrees, or the like) according to a design change of a designer.

Figure 6A:
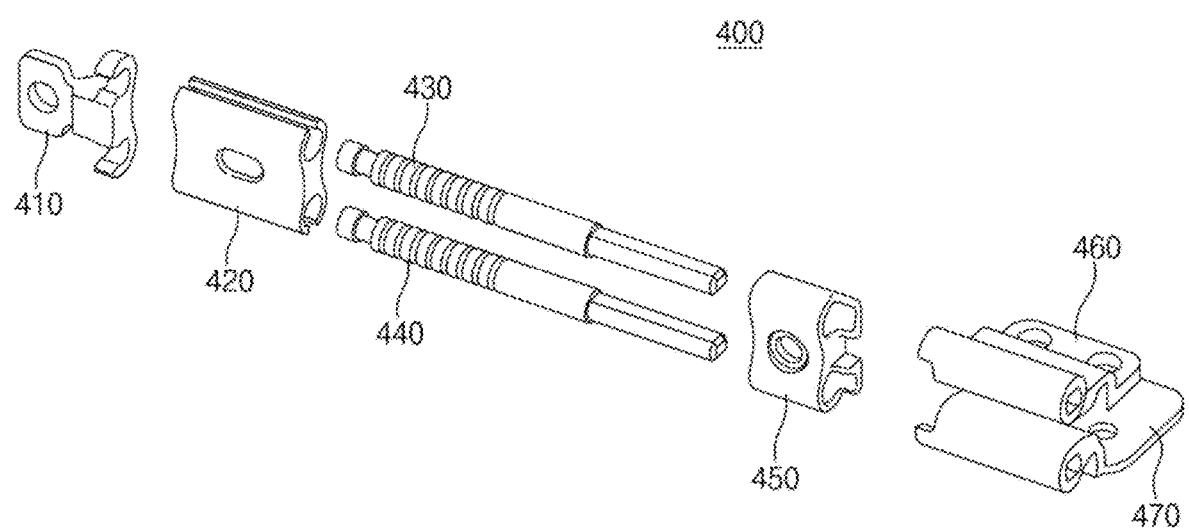
FIG. 6A illustrates an exploded perspective view of a hinge according to an embodiment.
Figure 6B:
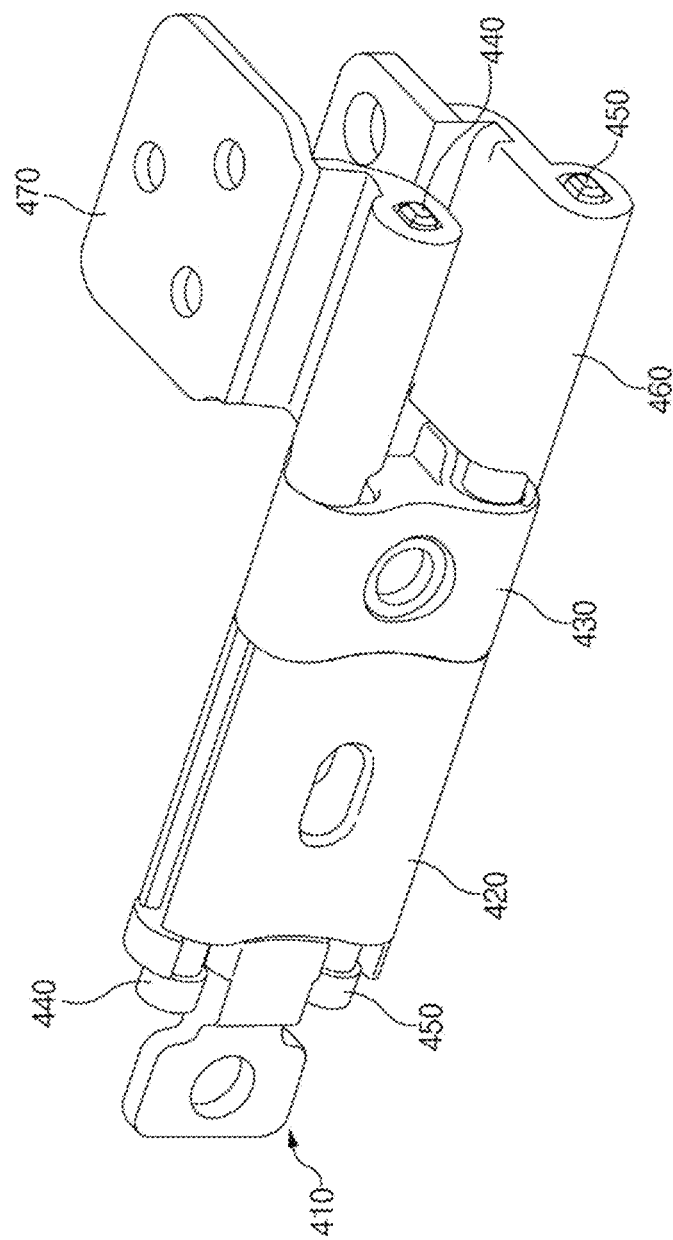
FIG. 6B illustrates an assembled perspective view of the hinge according to an embodiment of the present disclosure.

FIG. 6A illustrates an exploded perspective view of the hinge according to an embodiment of the present disclosure, and FIG. 6B illustrates an assembled perspective view of the hinge according to an embodiment of the present disclosure.

Referring to FIGS. 6A and 6B, the hinge 400 (e.g., the first hinge 400*a* or the second hinge 400*b*) of the present disclosure may include a shaft fixing part 410, a curling part 420, the first hinge shaft 430, the second hinge shaft 440, the stopping member 450, the first case connection 460, and the second case connection 470.

The shaft fixing part 410 may be fastened with a portion of a header section of the first hinge shaft 430 and the second hinge shaft 440. A lateral portion of the shaft fixing part 410 may be disposed to face a lateral portion of the curling part 420. A hole formed on a side of the shaft fixing part 410 may be used to fix the shaft fixing part 410 to the second hinge dummy 302.

The curling part 420 may have a predetermined thickness, area, and width. The curling part 420 may include, on an upper side thereof, a hole into which the first hinge shaft 430 is inserted and wings that form the hole and, on a lower side thereof, a hole into which the second hinge shaft 440 is inserted and wings that form the hole. When external pressure is applied, the hinge 400 according to an embodiment of the present disclosure may allow the first display device 100 to rotate within a specified angle range before the second display device 200, and when additional external pressure is applied after the first display device 100 rotates to a limit, the hinge 400 may allow the second display device 200 to rotate. In this regard, a first torque of the curling part 420 applied to the first hinge shaft 430 may differ from a second torque of the curling part 420 applied to the second hinge shaft 440.

The first hinge shaft 430 may be inserted into the upper hole (e.g., a first curling hole to be described below) formed in the curling part 420, and the header of the first hinge shaft 430 may be inserted into and fixed to the shaft fixing part 410. A surface of the first hinge shaft 430 that makes contact with an inner wall of the upper hole may be formed in a specified form to generate the first torque while the first hinge shaft 430 is inserted into the upper hole of the curling part 420. The first hinge shaft 430 may serve to connect the shaft fixing part 410, the curling part 420, the stopping member 450, and the first case connection 460.

The second hinge shaft 440 may be inserted into the lower hole (e.g., a second curling hole to be described below) formed in the curling part 420. The header section of the second hinge shaft 440 may be inserted into and fixed to the shaft fixing part 410, similarly to the header section of the first hinge shaft 430. A surface of the second hinge shaft 440 that makes contact with an inner wall of the lower hole of the curling part 420 may be formed in a specified form to generate the second torque. The second hinge shaft 440 may serve to connect the shaft fixing part 410, the curling part 420, the stopping member 450, and the second case connection 470.

The stopping member 450 may include a hole (e.g., a first mounting part to be described below) into which the first hinge shaft 430 is inserted and a hole (e.g., a second mounting part to be described below) into which the second hinge shaft 440 is inserted. The stopping member 450 may include the first stopper 451 restricting rotation of the first case connection 460 mounted on a distal end of the first hinge shaft 430 and the second stopper 452 restricting rotation of the second case connection 470 mounted on a distal end of the second hinge shaft 440.

One side of the first case connection 460 may be mounted on and fixed to the first hinge shaft 430, and an opposite side of the first case connection 460 may be fixed to the first case 120 of the first display device 100. A hole of the first case connection 460 into which the distal end of the first hinge shaft 430 is inserted may have at least one corner area and may be formed to correspond to the shape of the first hinge shaft 430. Accordingly, a force by which the first case connection 460 is rotated may be transmitted to the first hinge shaft 430, and the transmitted force may be reduced or removed by friction with the curling part 420.

One side of the second case connection 470 may be connected to the second hinge shaft 440, and an opposite side of the second case connection 470 may be fixed to the second case 220 of the second display device 200. Accordingly, a force that rotates the second display device 200 may be transmitted to the second hinge shaft 440, and the force transmitted to the second hinge shaft 440 may be reduced or removed by friction with the curling part 420.

Figure 7A:
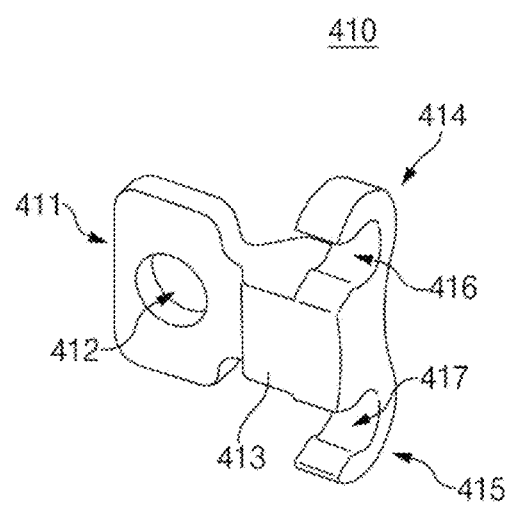
FIG. 7A illustrates a shaft fixing part according to an embodiment of the present disclosure.

FIG. 7A illustrates the shaft fixing part according to an embodiment of the present disclosure.

Referring to FIG. 7A, the shaft fixing part 410 may include a fixing part header 411, a hinge fixing hole 412, a fixing part body 413, a first wing 414, a first shaft insertion portion 416, a second wing 415, and a second shaft insertion portion 417.

The fixing part header 411 may have a panel shape with a predetermined surface, and the hinge fixing hole 412 may be formed in the center of the fixing part header 411. Considering that the fixing part header 411 is disposed on the second hinge dummy 302, the fixing part header 411 may have a curved shape.

The hinge fixing hole 412 may be formed in the center of the fixing part header 411 and may have a specified diameter. A screw may pass through the hinge fixing hole 412 and may be coupled to a threaded recess formed on the second hinge dummy 302. Accordingly, the shaft fixing part 410 may be fixed to the second hinge dummy 302.

The fixing part body 413 may be connected to a side of the fixing part header 411 and may have a gradually increasing section away from the fixing part header 411. The first wing 414 and the second wing 415 may be disposed on opposite sides of the fixing part body 413. The opposite sides of the fixing part body 413 may support the first hinge shaft 430 and the second hinge shaft 440 that are inserted into the first wing 414 and the second wing 415.

The first wing 414 may be disposed on one side of the fixing part body 413 and may have a hook or gaff shape. At least a portion of the first wing 414 that faces a first direction (e.g., the direction in which the hinge fixing hole 412 is formed through the fixing part header 411) may be removed to form the first shaft insertion portion 416. The thickness of the first wing 414 may be the same as, or similar to, the width of a shaft fixing groove of the first hinge shaft 430.

The first shaft insertion portion 416 may be formed by removing a side of the first wing 414. The size of the first shaft insertion portion 416 may correspond to the thickness of the first hinge shaft 430. For example, the size of the first shaft insertion portion 416 may be the same as, or similar to (e.g., smaller than), the diameter of the shaft fixing groove of the first hinge shaft 430. Accordingly, the shaft fixing groove of the first hinge shaft 430 may be press-fit into the first shaft insertion portion 416 and may be mounted in the first wing 414.

The second wing 415 may be formed to be the same as or similar to the first wing 414 and may be symmetric to the first wing 414 with respect to the fixing part body 413. The second shaft insertion portion 417 may be formed by removing a portion of the second wing 415. A shaft fixing groove of the second hinge shaft 440 may be inserted into the second shaft insertion portion 417 and may be mounted in the second wing 415. The size (or height) of the second shaft insertion portion 417 may be the same as, or smaller than, the diameter of the shaft fixing groove of the second hinge shaft 440 such that the second hinge shaft 440 is press-fit into the second shaft insertion portion 417.

Figure 7B:
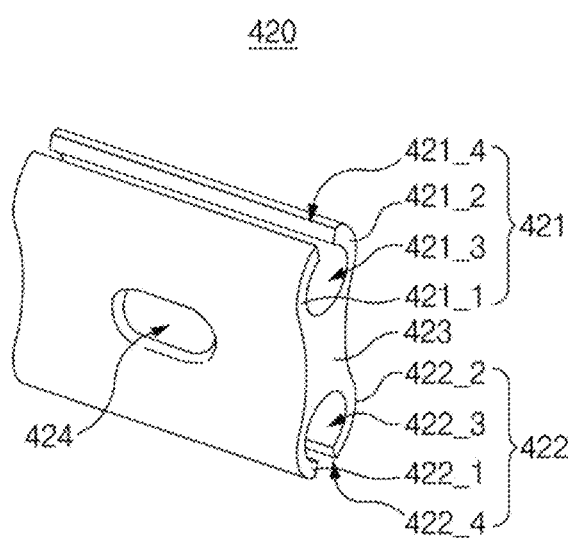
FIG. 7B illustrates a curling part according to an embodiment of the present disclosure.

FIG. 7B illustrates the curling part according to an embodiment of the present disclosure.

Referring to FIG. 7B, the curling part 420 may include a first curling part 421, and a second curling part 422, a curling part body 423, and a curling part fixing hole 424.

The first curling part 421 may include a first upper wing 421_1, a second upper wing 421_2, a first curling hole 421_3, and a first gap 421_4. The first upper wing 421_1 may extend upward from one edge of the curling part body 423 and may have a predetermined curvature. The second upper wing 421_2 may extend upward from an opposite edge of the curling part body 423 and may have a predetermined curvature. The first upper wing 421_1 and the second upper wing 421_2 may be arranged in a symmetric structure to face each other. The first curling hole 421_3 may be formed by the first upper wing 421_1 and the second upper wing 421_2 arranged to face each other. A predetermined area of the first hinge shaft 430 may be mounted in the first curling hole 421_3. The first gap 421_4 may include spacing between an upper end of the first upper wing 421_1 and an upper end of the second upper wing 421_2. Since the first gap 421_4 is formed, an elastic force may be applied in the direction in which the first upper wing 421_1 and the second upper wing 421_2 face each other or in the direction of compressing the first hinge shaft 430 when the first hinge shaft 430 is inserted into the first curling hole 421_3. The first gap 421_4 may vary depending on a torque value designed to be provided by the curling part 420.

The second curling part 422 may include a first lower wing 422_1, a second lower wing 422_2, a second curling hole 422_3, and a second gap 422_4. The first lower wing 422_1 and the second lower wing 422_2 may be disposed on a lower side of the curling part body 423 and may correspond to the shape of the first upper wing 421_1 and the second upper wing 421_2. For example, the first lower wing 422_1 and the second lower wing 422_2 may be symmetric to the first upper wing 421_1 and the second upper wing 421_2 with respect to the horizontal center line of the curling part body 423. The curved first and second lower wings 422_1 and 422_2 may face each other, and the second curling hole 422_3 where a predetermined area of the second hinge shaft 440 is inserted and fixed may be formed between the first and second lower wings 422_1 and 422_2. The second curling hole 422_3 may make contact with a predetermined portion of the second hinge shaft 440, and therefore friction may be generated while the second hinge shaft 440 is being rotated. The diameter of the second curling hole 422_3 may be the same as the diameter of the first curling hole 421_3. Alternatively, the first and second curling holes 421_3 and 422_3 may have different diameters such that torque associated with the first hinge shaft 430 is different from torque associated with the second hinge shaft 440. The second gap 422_4 may include spacing between a lower end of the first lower wing 422_1 and a lower end of the second lower wing 422_2. Since the first lower wing 422_1 and the second lower wing 422_2 are spaced apart from each other by the second gap 422_4, an elastic force may be applied to compress the second hinge shaft 440 while the second hinge shaft 440 is inserted into the second curling hole 422_3.

The curling part body 423 may include the curling part fixing hole 424 formed in the central portion thereof. While FIG. 7B illustrates that the central portion of the curling part body 423 has a curved shape, the present disclosure is not limited thereto. For example, at least a portion of the curling part body 423 may have a flat shape without separate curvature. The curling part fixing hole 424 may be formed through the central portion of the curling part body 423. The curling part fixing hole 424 may be arranged in the same direction as the above-described hinge fixing hole 412. The curling part fixing hole 424 may be used to fix the curling part 420 to the second hinge dummy 302.

Figure 7C:
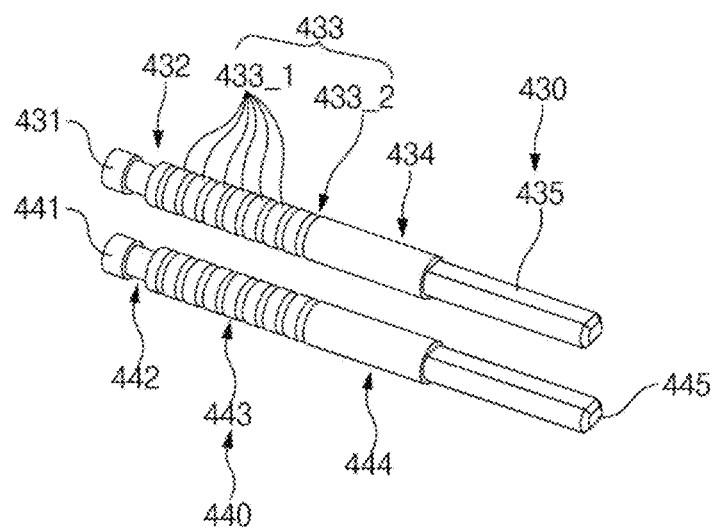
FIG. 7C illustrates hinge shafts according to an embodiment of the present disclosure.

FIG. 7C illustrates the hinge shafts according to an embodiment of the present disclosure.

Referring to FIG. 7C, the first hinge shaft 430 may include a first shaft header 431, a first shaft fixing groove 432, a first rotary friction part 433, a first shaft extension 434, and a first connection support rod 435. The first shaft header 431 may be fixed to the first wing 414 of the shaft fixing part 410. The first connection support rod 435 and the first shaft extension 434 may pass through the first curling hole 421_3 of the first curling part 421, and the first rotary friction part 433 may be disposed in the first curling hole 421_3.

The first shaft fixing groove 432 may be a strap-shaped groove with a smaller diameter than the first shaft header 431. The first shaft fixing groove 432 may be mounted in the first wing 414 of the shaft fixing part 410. When the first shaft fixing groove 432 is mounted in the first wing 414, the first shaft header 431 may face a left side surface of the first wing 414 to prevent the first hinge shaft 430 from moving leftwards and rightwards.

The first rotary friction part 433 may have a length corresponding to the entire length of the first curling hole 421_3. The first rotary friction part 433 may include, for example, strap-shaped protrusions 433_1 that make contact with an inner wall of the first curling hole 421_3 and strap-shaped grooves 433_2 that do not make contact with the inner wall of the first curling hole 421_3. The strap-shaped protrusions 433_1 may generate a frictional force against external pressure applied while the first hinge shaft 430 is being rotated. Accordingly, the strap-shaped protrusions 433_1 may allow the first hinge shaft 430 to be freely fixed within a specified angle range. Furthermore, the thickness and number of strap-shaped protrusions 433_1 may determine a torque value applied to the first hinge shaft 430. The strap-shaped grooves 433_2 may serve as a lubricant element when the first hinge shaft 430 rotates. As the width and number of strap-shaped grooves 433_2 increase, friction may be reduced, and thus a frictional force applied to the first hinge shaft 430 may be decreased.

The first shaft extension 434 may be arranged next to the first rotary friction part 433. The first shaft extension 434 may have a length similar to the width of the stopping member 450. For example, the first shaft extension 434 may have a smaller diameter than the hole formed inside the stopping member 450. Alternatively, the hole formed inside the stopping member 450 may have a larger diameter than the first shaft extension 434. The first shaft extension 434 may serve to support the stopping member 450.

The first connection support rod 435 may be arranged next to the first shaft extension 434. As illustrated in FIG. 7C, the first connection support rod 435 may include at least one corner. For example, the first connection support rod 435 may have a rectangular prismatic shape, a chamfered asymmetric shape, or the like. The first connection support rod 435 may be inserted into the first case connection 460. Accordingly, a rotational force may be transmitted to the first shaft extension 434 and the first rotary friction part 433 when the first case connection 460 rotates in a predetermined direction.

The second hinge shaft 440 may include a second shaft header 441, a second shaft fixing groove 442, a second rotary friction part 443, a second shaft extension 444, and a second connection support rod 445. The second shaft header 441 may be formed to be identical or similar to the first shaft header 431 described above. The second shaft fixing groove 442 may be formed to be identical or similar to the first shaft fixing groove 432 described above. The second rotary friction part 443 may have a shape similar to that of the first rotary friction part 433, but may have a different diameter than the first rotary friction part 433. Alternatively, the second rotary friction part 443 may be formed to be different from the first rotary friction part 433 (e.g., in terms of at least one of the strap-shaped protrusions 433_1 and the strap-shaped grooves 433_2) to have a different torque value. The second shaft extension 444 may be arranged next to the second rotary friction part 443, and the second connection support rod 445 may be arranged next to the second shaft extension 444. The second shaft extension 444 and the second connection support rod 445 may be formed to be identical or similar to the first shaft extension 434 and the first connection support rod 435. The above-described second hinge shaft 440 may include the second rotary friction part 443 disposed in the second curling hole 422_3 of the second curling part 422, the second shaft fixing groove 442 fixed to the second wing 415 of the shaft fixing part 410, and the second shaft header 441 disposed to face a side surface of the second wing 415 to prevent the second hinge shaft 440 from moving leftwards and rightwards.

Figure 7D:
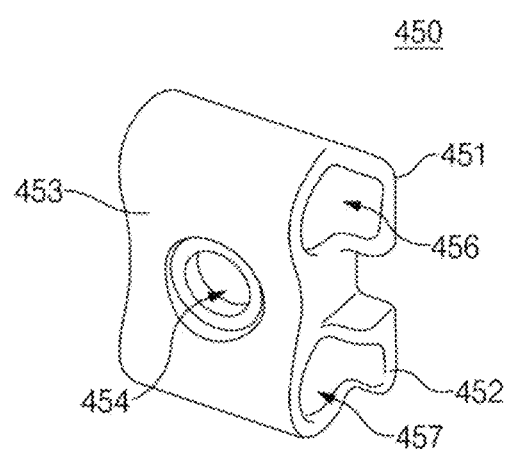
FIG. 7D illustrates a stopping member according to an embodiment of the present disclosure.

FIG. 7D illustrates the stopping member according to an embodiment of the present disclosure.

Referring to FIG. 7D, the stopping member 450 may include the first stopper 451, the second stopper 452, a stopping member body 453, a stopping member fixing hole 454, a first mounting portion 456, and a second mounting portion 457.

The first mounting portion 456 may be formed through the stopping member body 453 in a horizontal direction from one side of the stopping member body 453, and the first shaft extension 434 of the first hinge shaft 430 may be inserted into the first mounting portion 456. The second mounting portion 457 may be formed through the stopping member body 453 in a horizontal direction from one side of the stopping member body 453, and the second shaft extension 444 of the second hinge shaft 440 may be inserted into the second mounting portion 457. The first mounting portion 456 and the second mounting portion 457 may be formed parallel to each other on an upper side and a lower side of the stopping member body 453. The first mounting portion 456 and the second mounting portion 457 may be formed to be identical or similar to each other. The stopping member fixing hole 454 may be formed in the center of the stopping member body 453. A screw may be inserted into the stopping member fixing hole 454. The inserted screw may be screw-coupled to the second hinge dummy 302 on which the hinge 400 is mounted. For example, the first mounting portion 456 may have a larger diameter than the first shaft extension 434. For example, the second mounting portion 457 may have a larger diameter than the second shaft extension 444.

As described above, the first stopper 451 may be formed to the specified height from the side surface of the stopping member body 453 such that the first case connection 460 coupled to the first connection support rod 435 of the first hinge shaft 430 moves within the first angle range. The second stopper 452 may be formed to the specified height from the side surface of the stopping member body 453 such that the second case connection 470 coupled to the second connection support rod 445 of the second hinge shaft 440 moves within the second angle range.

Figure 7E:
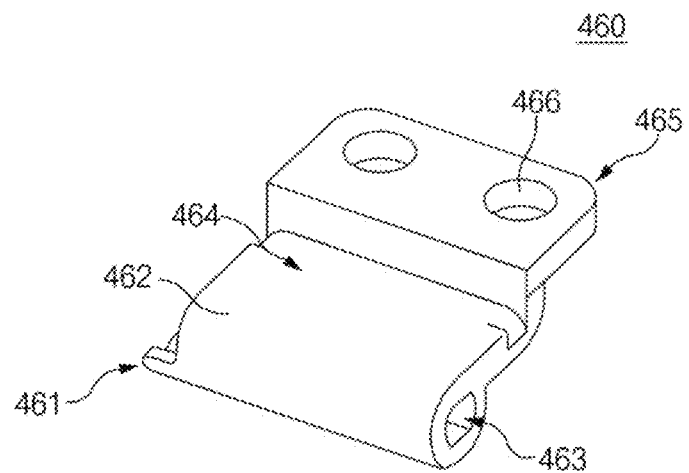
FIG. 7E illustrates a first case connection according to an embodiment of the present disclosure.

FIG. 7E illustrates the first case connection according to an embodiment of the present disclosure.

Referring to FIG. 7E, the first case connection 460 may include the first case stopping member 461, a first hole body 462, a first support rod insertion hole 463, a first connection body 464, a first fastening part 465, and first fastening holes 466.

The first case stopping member 461 may protrude a specified height from a side surface of the first hole body 462 toward the first hinge shaft 430. The width of the first case stopping member 461 may vary depending on design of an angle by which the first case connection 460 is capable of rotating. The first hole body 462 may have a shape that surrounds the first support rod insertion hole 463. The first hole body 462 may have a rounded exterior, and the first case stopping member 461 may be located on the lateral portion of the first hole body 462.

The first support rod insertion hole 463 may have the same section as, or a section similar to (e.g., slightly larger than), the section of the first connection support rod 435. For example, the first support rod insertion hole 463 may include at least one corner.

The first connection body 464 may serve to connect the first hole body 462 and the first fastening part 465. For example, the first connection body 464 may be formed in an L shape. The first fastening part 465 may be disposed at one end of the first connection body 464. The first fastening part 465 may have, for example, a predetermined area and width, and the first fastening holes 466 may be formed through the central portion of the first fastening part 465. While the two first fastening holes 466 are illustrated in FIG. 7E, the number of first fastening holes 466 may vary depending on the purpose of design. The size of the first fastening holes 466 may be determined based on the diameter of a screw inserted into the first fastening holes 466 and the shape of the first hinge coupling part 121 formed on the first case 120.

Figure 7F:
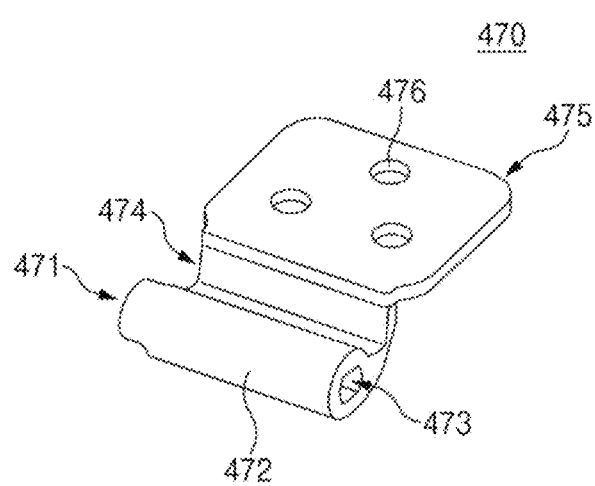
FIG. 7F illustrates a second case connection according to an embodiment of the present disclosure.

FIG. 7F illustrates the second case connection according to an embodiment of the present disclosure.

Referring to FIG. 7F, the second case connection 470 may include the second case stopping member 471, a second hole body 472, a second support rod insertion hole 473, a second connection body 474, a second fastening part 475, and second fastening holes 476.

The second case stopping member 471 may protrude a specified height from a side surface of the second hole body 472 toward the second hinge shaft 440. The second case stopping member 471 may have a shape that surrounds a portion of the second hinge shaft 440 inserted into the second support rod insertion hole 473. The width of the second case stopping member 471 may vary depending on a design range of an angle by which the second case connection 470 is capable of rotating. The second hole body 472 may have a shape that surrounds the second support rod insertion hole 473. The second hole body 472 may have a rounded exterior, and the second case stopping member 471 may be located on the lateral portion of the second hole body 472. The second support rod insertion hole 473 may have the same section as, or a section similar to (e.g., slightly larger than), the section of the second connection support rod 445. For example, the second support rod insertion hole 473 may include at least one corner.

The second connection body 474 may serve to connect the second hole body 472 and the second fastening part 475. For example, the second connection body 474 may be formed in an L shape. The second fastening part 475 may be disposed at one end of the second connection body 474. The second fastening part 475 may have, for example, a predetermined area and width, and the second fastening holes 476 may be formed through the central portion of the second fastening part 475. For example, the second fastening part 475 may have the same thickness as, or a thickness different from, that of the first fastening part 465. While the three second fastening holes 476 are illustrated in FIG. 7F, the number of second fastening holes 476 may vary depending on the purpose of design. The size of the second fastening holes 476 may be determined based on the diameter of a rivet inserted into the second fastening holes 476 and the shape of the second hinge coupling part 221 formed on the second case 220. According to various embodiments, the second fastening part 475 may be screw-coupled with the second hinge coupling part 221.

Figure 8A:
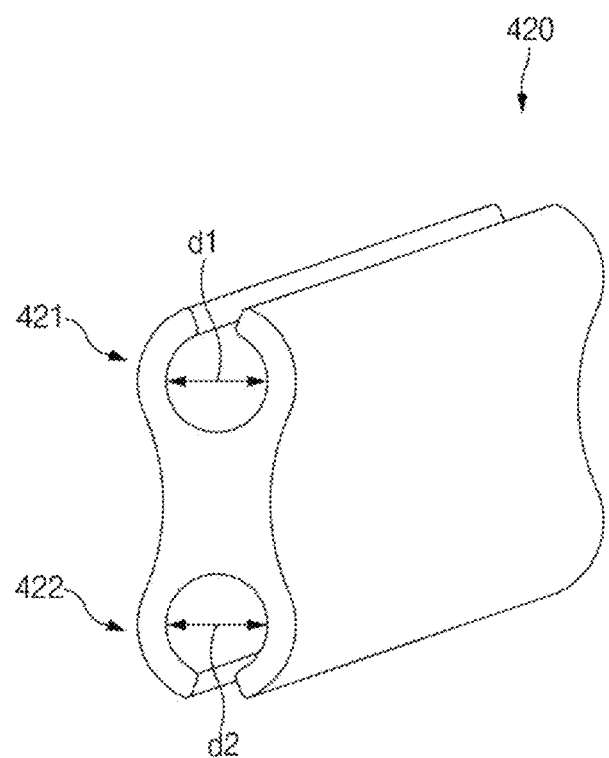
FIG. 8A illustrates a first form of the curling part according to an embodiment of the present disclosure.

FIG. 8A illustrates a first form of the curling part according to an embodiment of the present disclosure.

Referring to FIG. 8A, the curling part 420 according to an embodiment may include the first curling part 421 and the second curling part 422 that have different diameters. For example, the first curling part 421 to which the first hinge shaft 430 is connected may have a first diameter d1, and the second curling part 422 to which the second hinge shaft 440 is connected may have a second diameter d2.

The first diameter d1 may correspond to the diameter of a curling hole formed by upper wings that form the first curling part 421. The first diameter d1 may be the same as, or similar to (e.g., smaller than), the diameter of the first hinge shaft 430. Accordingly, the first curling part 421 may make contact with the first hinge shaft 430 to provide a frictional force to the first hinge shaft 430 while the first hinge shaft 430 is rotating.

The first diameter d1 may be greater than the second diameter d2. For example, the first diameter d1 may be greater than the second diameter d2 by several millimeters or several micrometers. Therefore, different torques may be applied to the first and second hinge shafts 430 and 440 by the first and second curling holes 421_3 and 422_3 even though the first and second hinge shafts 430 and 440 have the same diameter and shape. The first diameter d1 and the second diameter d2 may vary depending on the magnitudes of torques to be designed. In the case where the first diameter d1 is greater than the second diameter d2, the first display device 100 connected to the first hinge shaft 430 may rotate to a limit range before the second display device 200 connected to the second hinge shaft 440 when external pressure is applied.

Figure 8B:
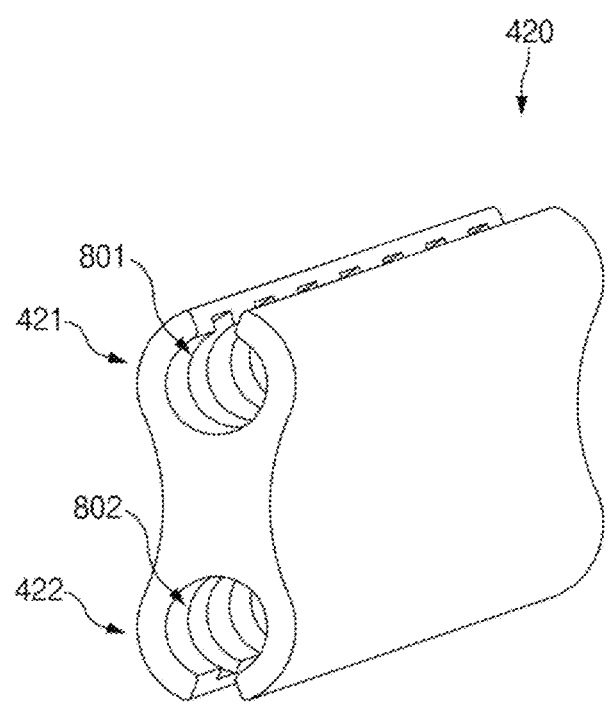
FIG. 8B illustrates a second form of the curling part according to an embodiment of the present disclosure.

FIG. 8B illustrates a second form of the curling part according to an embodiment of the present disclosure.

Referring to FIG. 8B, the curling part 420 according to an embodiment may include the first curling part 421 and the second curling part 422 that have grooves formed on at least a portion of the inner wall thereof.

For example, the first curling part 421 may include one or more first strap-shaped grooves 801 engraved to a specified depth on the inner wall thereof that forms a curling hole. The first curling part 421 may have a relatively small contact area with the rotary friction part 433 of the first hinge shaft 430 inserted into the first curling part 421, compared with a curling part that does not have the first strap-shaped grooves 801. Therefore, the first curling part 421 may apply a relatively small torque to the first hinge shaft 430, compared with the curling part that does not have the first strap-shaped grooves 801.

Similarly to the first curling part 421, the second curling part 422 may include one or more second strap-shaped grooves 802 engraved to a specified depth on the inner wall thereof that forms a curling hole. The width and number of second strap-shaped grooves 802 may be different from the width and number of first strap-shaped grooves 801. Therefore, the second curling part 422 may apply, to the second hinge shaft 440, a different magnitude of torque from the torque that the first curling part 421 applies to the first hinge shaft 430. According to an embodiment, the first strap-shaped grooves 801 may be wider than the second strap-shaped grooves 802. Alternatively, the number of first strap-shaped grooves 801 may be larger than the number of second strap-shaped grooves 802. In another case, more first strap-shaped grooves 801 having a larger width may be formed than the second strap-shaped grooves 802. Therefore, a first torque applied to the first hinge shaft 430 inserted into the first curling part 421 may be smaller than a second torque applied to the second hinge shaft 440 inserted into the second curling part 422.

Although the plurality of first strap-shaped grooves 801 and the plurality of second strap-shaped grooves 802 are illustrated as being arranged in the vertical direction, the present disclosure is not limited thereto. For example, the first and second strap-shaped grooves 801 and 802 having a circular arc shape may be replaced with one or more rail grooves engraved on the inner walls of the curling holes in the longitudinal direction. For example, the first curling part 421 may include one or more first rail grooves with a specified width that are engraved on the inner wall thereof, which forms the curling hole, in the longitudinal direction. Furthermore, the second curling part 422 may include one or more second rail grooves with a specified width that are engraved on the inner wall thereof, which forms the curling hole, in the longitudinal direction. The width and number of first rail grooves may be larger than the width and number of second rail grooves.

Figure 8C:
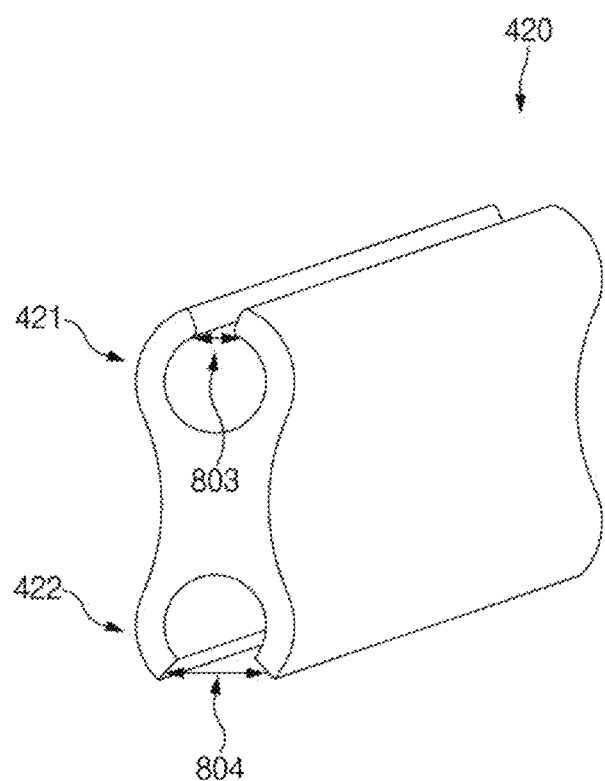
FIG. 8C illustrates a third form of the curling part according to an embodiment of the present disclosure.

FIG. 8C illustrates a third form of the curling part according to an embodiment of the present disclosure.

Referring to FIG. 8C, the curling part 420 according to an embodiment may include the first curling part 421 and the second curling part 422 that have different gaps between wings thereof.

As described above, a first gap 803 formed in the first curling part 421 may correspond to spacing between upper ends of first and second upper wings. The first gap 803 may correspond to a first distance. A second gap 804 formed in the second curling part 422 may correspond to spacing between lower ends of first and second lower wings. The second gap 804 may correspond to a second distance. For example, the first distance may be shorter than the second distance. In the case where the first distance of the first gap 803 or the second distance of the second gap 804 is relatively short, the surface areas of inner surfaces of the first and second upper wings (or the first and second lower wings) may be larger than in the case where the first distance of the first gap 803 or the second distance of the second gap 804 is long. Therefore, the contact area with the inserted first or second hinge shaft 430 or 440 may be increased, which results in an increase in torque.

Alternatively, in the case where the first distance of the first gap 803 or the second distance of the second gap 804 is relatively long, the surface areas of the inner surfaces of the first and second upper wings (or the first and second lower wings) may be smaller than in the case where the first distance of the first gap 803 or the second distance of the second gap 804 is short. Therefore, the contact area with the inserted first or second hinge shaft 430 or 440 may be decreased, which results in a reduction in torque. The first or second distance may have a specified distance depending on the magnitude of torque to be designed.

According to various embodiments, the first distance may be longer than the second distance in the case where a first torque applied to the first hinge shaft 430 inserted into the first curling part 421 is designed to be smaller than a second torque applied to the second hinge shaft 440 inserted into the second curling part 422. Alternatively, the first distance may be shorter than the second distance in the case where the first torque applied to the first hinge shaft 430 inserted into the first curling part 421 is designed to be larger than the second torque applied to the second hinge shaft 440 inserted into the second curling part 422.

Figure 9A:
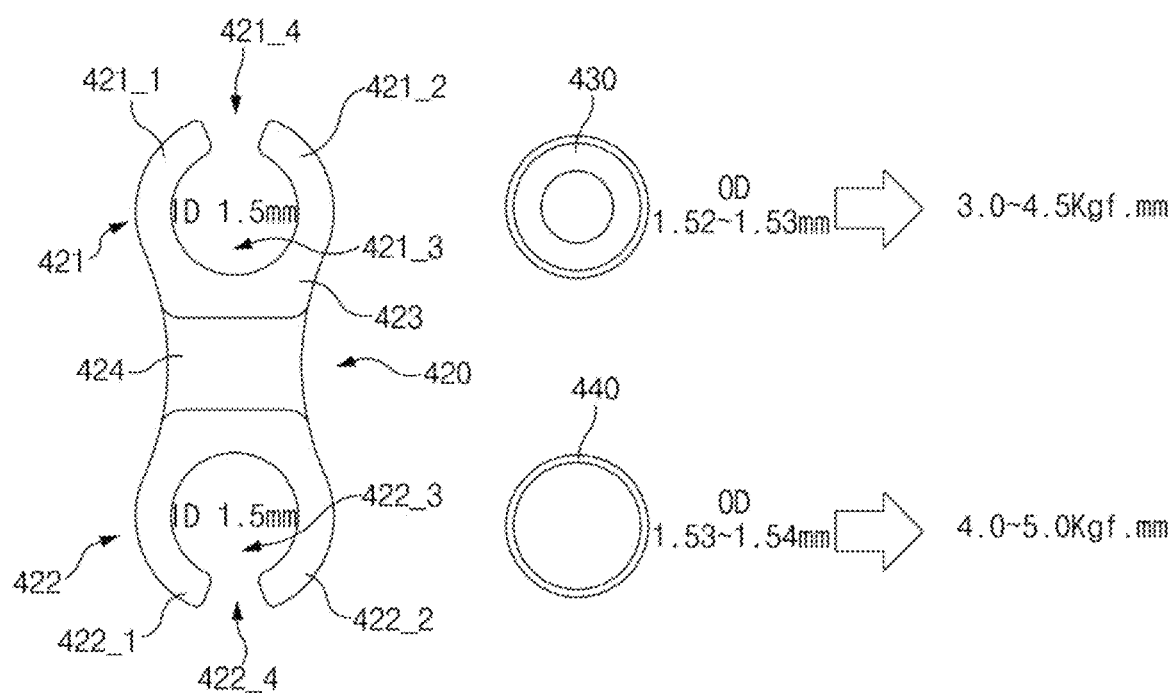
FIG. 9A illustrates a first form of the hinge shafts for preventing twisting according to an embodiment of the present disclosure.

FIG. 9A illustrates a first form of the hinge shafts for preventing twisting according to an embodiment of the present disclosure.

Referring to FIG. 9A, the hinge 400 may include the curling part 420 and the hinge shafts 430 and 440 that have a specified shape to form torque for a rotary motion. The curling part 420 may include the first curling part 421, the second curling part 422, and the curling part fixing hole 424. The first curling part 421 may have the first curling hole 421_3 formed by the first upper wing 421_1 and the second upper wing 421_2 that have a curved shape and are arranged to form the first gap 421_4. The first curling hole 421_3 may have a specified diameter (e.g., 1.5 mm, the diameter being variable depending on the size of an electronic device to which an application is made, the size of the hinge, or the like). The second curling part 422 may have the second curling hole 422_3 formed by the first lower wing 422_1 and the second lower wing 422_2 that have a curved shape and are arranged to form the second gap 422_4. The second curling hole 422_3 may have the specified diameter (e.g., 1.5 mm). As described above, the first curling part 421 and the second curling part 422 may be vertically symmetric to each other with respect to the curling part fixing hole 424.

The first hinge shaft 430 may have a first diameter (e.g., 1.52 mm to 1.53 mm, the first diameter being variable depending on the diameter of the first curling hole 421_3). Accordingly, a first torque (e.g., 3.0 kgf·mm to 4.5 kgf·mm) may be generated by the first curling part 421 and the first hinge shaft 430. The second hinge shaft 440 may have a second diameter (e.g., 1.53 mm to 1.54 mm, the second diameter being variable depending on the diameter of the second curling hole 422_3). Accordingly, a second torque (e.g., 4.0 kgf·mm to 5.0 kgf·mm) may be generated by the second curling part 422 and the second hinge shaft 440.

Since the torques applied to the first hinge shaft 430 and the second hinge shaft 440 differ from each other (the first torque is smaller than the second torque) as described above, the first hinge shaft 430 may perform a rotary motion before the second hinge shaft 440 when external pressure is applied. Thereafter, the second hinge shaft 440 may perform a rotary motion after the first hinge shaft 430 when the external pressure continues to be applied after the rotation of the first hinge shaft 430 to a specified limit.

Figure 9B:
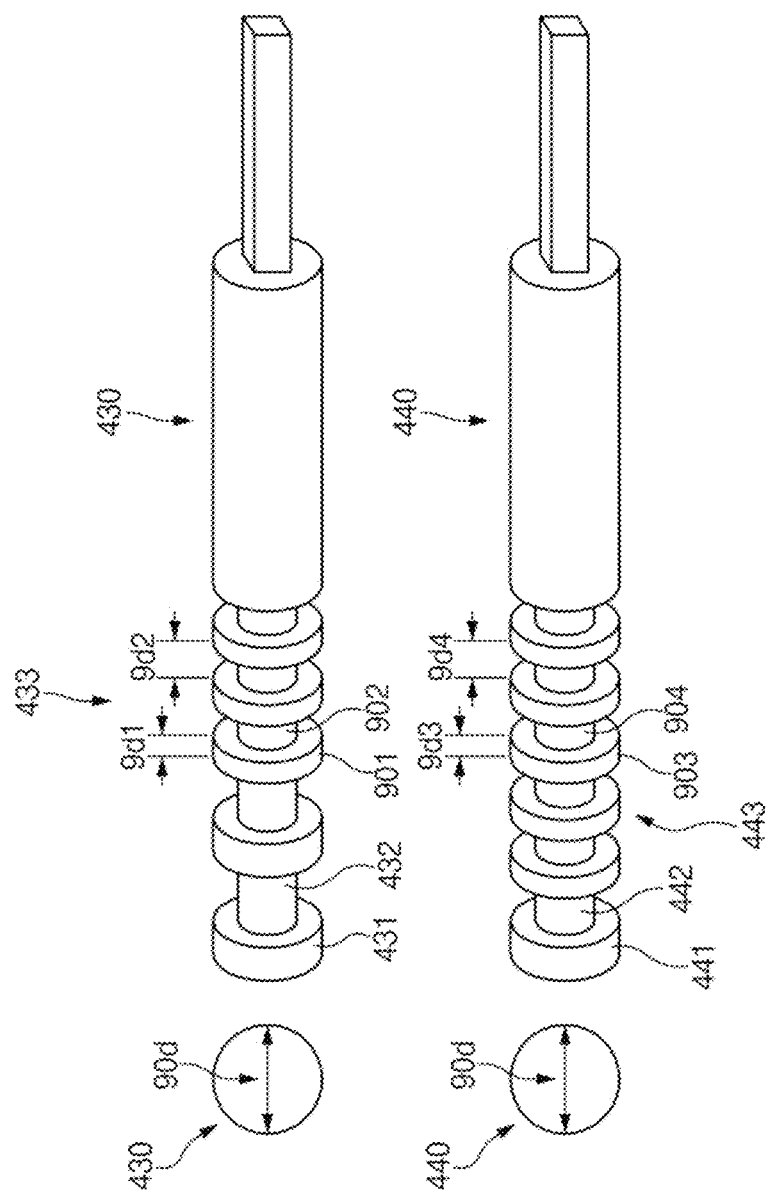
FIG. 9B illustrates a second form of the hinge shafts for preventing twisting according to an embodiment of the present disclosure.

FIG. 9B illustrates a second form of the hinge shafts for preventing twisting according to an embodiment of the present disclosure.

Referring to FIG. 9B, according to an embodiment, the first hinge shaft 430 may include the first shaft header 431, the first shaft fixing groove 432, and the first rotary friction part 433, as illustrated in the drawing, and the first rotary friction part 433 may include first strap-shaped protrusions 901 with a first thickness $9d1$ and first strap-shaped grooves 902 with a second thickness $9d2$. The first thickness $9d1$ may be the same as the second thickness $9d2$. Alternatively, the first thickness $9d1$ and the second thickness $9d2$ may differ from each other depending on the magnitude of torque to be designed. Furthermore, the number of first strap-shaped protrusions 901 may differ from the number of first strap-shaped grooves 902, depending on the magnitude of torque to be designed. The first rotary friction part 433 may have a specified diameter $90d$.

The second hinge shaft 440 may include the second shaft header 441, the second shaft fixing groove 442, and the second rotary friction part 443, and the second rotary friction part 443 may include second strap-shaped protrusions 903 with a third thickness $9d3$ and second strap-shaped grooves 904 with a fourth thickness $9d4$. The third thickness $9d3$ and the fourth thickness $9d4$ may be the same as, or different from, each other depending on the magnitude of torque to be designed. Furthermore, the number of second strap-shaped protrusions 903 may be the same as, or differ from, the number of second strap-shaped grooves 904, depending on the magnitude of torque to be designed. The second rotary friction part 443 may have a specified diameter $90d$ that is the same as, or similar to, the diameter of the first rotary friction part 433.

According to an embodiment, the elements of the first rotary friction part 433 for generating torque (e.g., at least one of the first thickness $9d1$, the second thickness $9d2$, the width and number of first strap-shaped protrusions 901, and the width and number of first strap-shaped grooves 902) may be different from those of the second rotary friction part 443 for generating torque (e.g., at least one of the third thickness $9d3$, the fourth thickness $9d4$, the width and number of second strap-shaped protrusions 903, and the width and number of second strap-shaped grooves 904). For example, the first thickness $9d1$ may be smaller than the third thickness $9d3$. Alternatively, the second thickness $9d2$ may be larger than the fourth thickness $9d4$. In another case, the number of first strap-shaped protrusions 901 may be smaller than the number of second strap-shaped protrusions 903 in the case where the first thickness $9d1$ is the same as the third thickness $9d3$ (or even though the first thickness $9d1$ is different from the third thickness $9d3$). In another case, the number of first strap-shaped grooves 902 may be larger than the number of second strap-shaped grooves 904 in the case where the second thickness $9d2$ is the same as the fourth thickness $9d4$ (or even though the second thickness $9d2$ is different from the fourth thickness $9d4$).

Figure 9C:
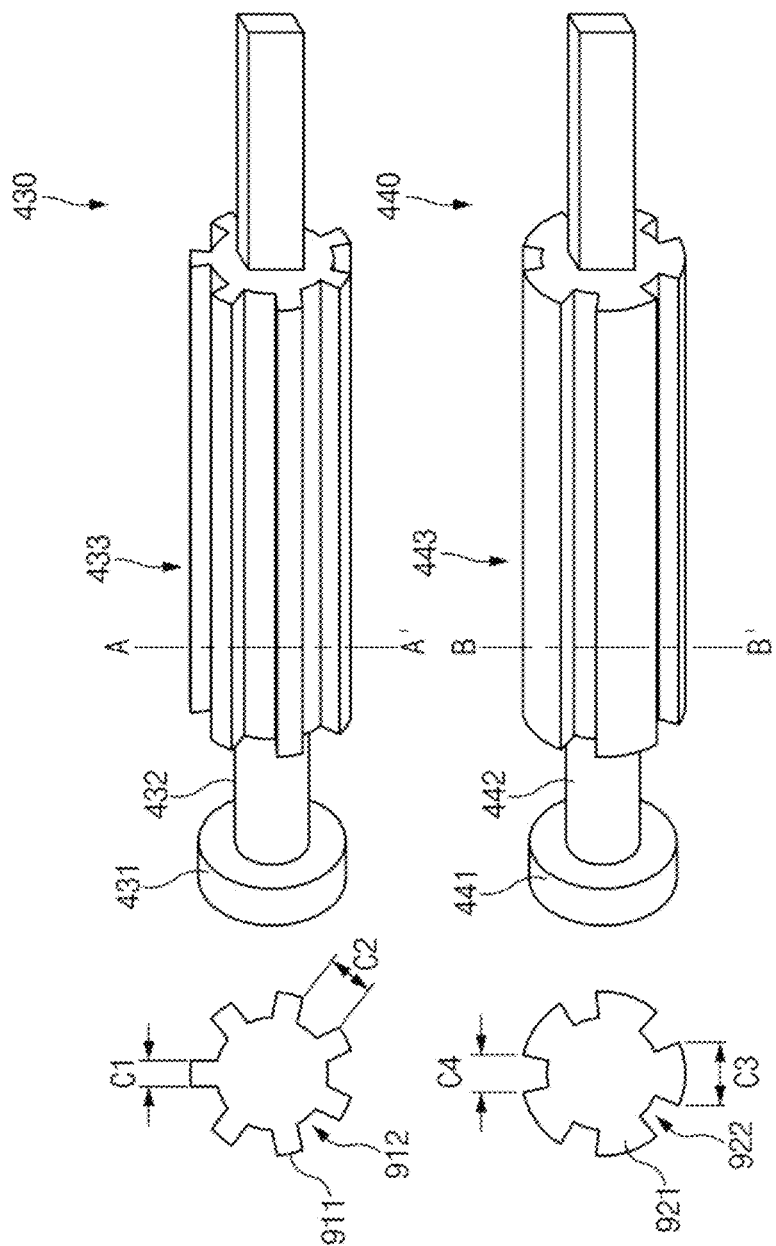
FIG. 9C illustrates a third form of the hinge shafts for preventing twisting according to an embodiment of the present disclosure.

FIG. 9C illustrates a third form of the hinge shafts for preventing twisting according to an embodiment of the present disclosure.

Referring to FIG. 9C, according to an embodiment, the first hinge shaft 430 may include the first shaft header 431, the first shaft fixing groove 432, and the first rotary friction part 433. Furthermore, the first hinge shaft 430 may further include a shaft extension for arrangement of a stopping member after the first rotary friction part 433 and a connection support rod for arrangement of a case connection. The first rotary friction part 433 may include first rail protrusions 911 with a first thickness $c1$ and first rail grooves 912 with a second thickness $c2$. The first rail protrusions 911 and the first rail grooves 912 may be arranged in the longitudinal direction of the first hinge shaft 430. The first thickness $c1$ and the second thickness $c2$ may vary depending on the magnitude of torque to be designed. Furthermore, the number of first rail protrusions 911 may differ from the number of first rail grooves 912, depending on the magnitude of torque to be designed. The diameter of the first rotary friction part 433 may be the same as, or different from, the diameter of the second rotary friction part 443.

According to an embodiment, the second hinge shaft 440 may include the second rotary friction part 443. The second rotary friction part 443 may include second rail protrusions 921 with a third thickness $c3$ and second rail grooves 922 with a fourth thickness $c4$. The second rail protrusions 921 and the second rail grooves 922 may be arranged in the longitudinal direction of the second hinge shaft 440. The third thickness $c3$ and the fourth thickness $c4$ may vary depending on the magnitude of torque to be designed.

According to an embodiment, the first thickness $c1$ of the first rail protrusions 911 may be smaller than the third thickness $c3$ of the second rail protrusions 921 to make a first torque applied to the first hinge shaft 430 smaller than a second torque applied to the second hinge shaft 440. Alternatively, the second thickness $c2$ of the first rail grooves 912 may be larger than the fourth thickness $c4$ of the second rail grooves 922. In another case, the number of first rail protrusions 911 may be smaller than the number of second rail protrusions 921 in the case where the first thickness $c1$ is the same as the third thickness $c3$ (or even though the first thickness $c1$ is different from the third thickness $c3$). In another case, the number of first rail grooves 912 may be larger than the number of second rail grooves 922 in the case where the second thickness $c2$ is the same as the fourth thickness $c4$ (or even though the second thickness $c2$ is different from the fourth thickness $c4$).

According to various embodiments, at least one of the shape of the first rotary friction part 433 of the first hinge shaft 430 and the shape of the second rotary friction part 443 of the second hinge shaft 440 may be formed by vertical strap-shaped grooves and horizontal rail grooves that cross each other (e.g., in a matrix form). In this case, one or more protrusions having a grid form and a predetermined height may be arranged on a surface of at least one of the first rotary friction part 433 and the second rotary friction part 443. The surface area and/or number of protrusions with a grid form that are formed on the first rotary friction part 433 may differ from the surface area and/or number of protrusions with a grid form that are formed on the second rotary friction part 443. For example, the first rotary friction part 433 may have a smaller number of protrusions than the second rotary friction part 443, or the protrusions of the first rotary friction part 433 may have a smaller surface area than those of the second rotary friction part 443. In this regard, the first rotary friction part 433 may differ from the second rotary friction part 443 in terms of the thickness and number of rail grooves and strap-shaped grooves, the width between the rail grooves, the width between the strap-shaped grooves, and the like.

According to various embodiments, the curling parts 421 and 422 described above with reference to FIG. 8A, 8B, or 8C and the hinge shafts 430 and 440 described above with reference to FIG. 9A, 9B, or 9C may be employed to make the first torque applied to the first hinge shaft 430 different from the second torque applied to the second hinge shaft 440 (e.g., to make the first torque smaller or larger than the second torque). For example, at least one of the following forms may be employed for the hinge 400 to make the first torque and the second torque different from each other: a first form in which curling holes have different diameters; a second form in which strap-shaped grooves (e.g., grooves with a circular arc shape or grooves with a rail shape) are formed on inner walls of curling holes; a third form in which gaps of curling parts differ from each other; a fourth form in which hinge shafts have different diameters; a fifth form in which rotary friction parts have round straps with different shapes; a sixth form in which rotary friction parts have different longitudinal grooves; and a seventh form in which rotary friction parts have a different number and form of protrusions (e.g., depressed portions being vertically and horizontally arranged in a matrix form to have a protrusion shape).

Figure 10:
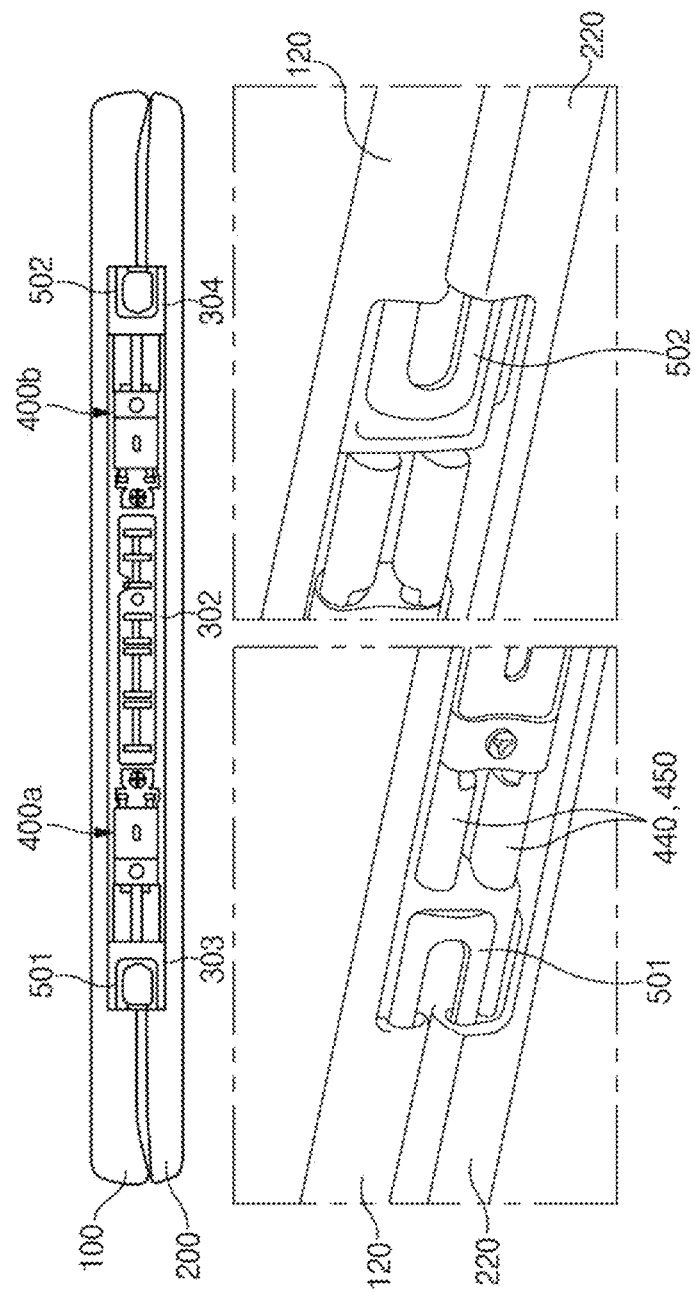
FIG. 10 illustrates a side view of the electronic device having the hinge module fastened thereto according to an embodiment of the present disclosure.

FIG. 10 illustrates a side view of the electronic device having the hinge module fastened thereto according to an embodiment of the present disclosure.

Referring to FIG. 10, the illustrated electronic device may be, for example, a dual display device that includes the first display device 100 and the second display device 200. The first display device 100 and the second display device 200 may be fastened to each other through the hinge module and may rotate within a specified angle range.

The hinge module may include the first hinge 400a and the second hinge 400b. Furthermore, the hinge module may further include the second hinge dummy 302 on which the first hinge 400a and the second hinge 400b are mounted and the third and fourth hinge dummies 303 and 304 disposed on the opposite sides of the second hinge dummy 302. Additionally, as described above, the first hinge dummy 301 may be disposed to cover the second hinge dummy 302, on which the first hinge 400a and the second hinge 400b are mounted, the third hinge dummy 303, and the fourth hinge dummy 304.

At least a portion of a first signal line 501 between the first display device 100 and the second display device 200 may be disposed in the third hinge dummy 303. In addition, at least a portion of a second signal line 502 between the first display device 100 and the second display device 200 may be disposed in the fourth hinge dummy 304. According to various embodiments, the electronic device may include at least one of the first signal line 501 and the second signal line 502. The first hinge dummy 301 may be hook-coupled with the third hinge dummy 303 and the fourth hinge dummy 304 in the process of covering the third hinge dummy 303 and the fourth hinge dummy 304. At this time, the first signal line 501 and the second signal line 502 may be mounted on the third hinge dummy 303 and the fourth hinge dummy 304 to avoid the hook-coupling structure.

At least one of the first signal line 501 and the second signal line 502 may transmit signals (e.g., a display signal, a touch signal, a control signal, and a power signal) between the first display device 100 and the second display device 200. According to an embodiment, the first display device 100 may transmit a control signal, a display signal, and a power signal to the second display device 200 through at least one of the first signal line 501 and the second signal line 502. Furthermore, the second display device 200, when supporting a touch screen function, may transmit an input signal to the first display device 100 through at least one of the first signal line 501 and the second signal line 502.

As described above, the hinge module, and the cases and the electronic device that include the hinge module, according to embodiments of the present disclosure, may support connection and rotation between the cases that require a predetermined length or less, by using the hinges into which the two shafts are inserted.

Figure 11:
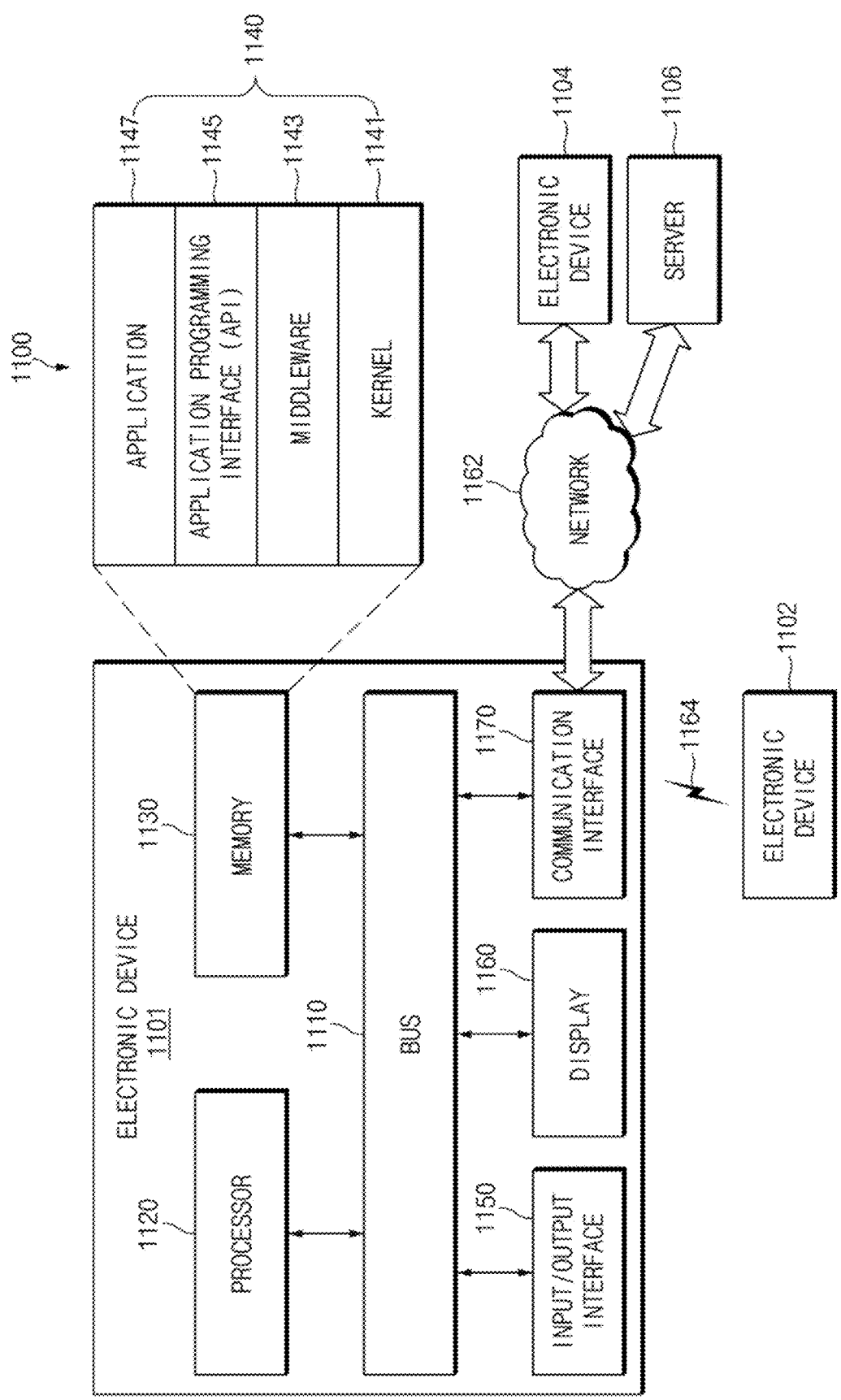
FIG. 11 illustrates a block diagram 1100 of a network environment according to various embodiments.

FIG. 11 is a block diagram 1100 illustrating a network environment, according to various embodiments.

Referring to FIG. 11, according to various embodiments, an electronic device 1101, 1102, or 1104, or a server 1106 may be connected each other over a network 1162 or a short range communication 1164. The electronic device 1101 may include a bus 1110, a processor 1120, a memory 1130, an input/output interface 1150, a display 1160, and a communication interface 1170. According to an embodiment, the electronic device 1101 may not include at least one of the above-described elements or may further include other element(s). The above-described electronic device 1101 may include the electronic device 10 described in FIG. 1A. In this case, the display 1160 may include a form in which at least two displays are connected with each other through a hinge.

For example, the bus 1110 may interconnect the above-described elements 1120 to 1170 and may include a circuit for conveying communications (e.g., a control message and/or data) among the above-described elements. In the case where the bus 1110 is applied to the electronic device 10, a part of the bus 1110 may be disposed in the hinge for connecting the signal between a first display device and a second display device.

The processor 1120 may include one or more of a central processing unit (CPU), an application processor (AP), and a communication processor (CP). For example, the processor 1120 may perform operations or data processing associated with control and/or communication of at least one other element of the electronic device 1101. According to various embodiments, the processor 1120 may process an operation of a payment application. For example, the processor 1120 may perform signal processing associated with registration of a payment means and may provide a user interface required for the process of registering the payment means. In addition, the processor 1120 may perform signal processing associated with the progress of a payment based on the registered payment means. The processor 1120 may operate to control the first display device and the second display device in the electronic device 10. According to various embodiments, the processor 1120 may include one processor and may be disposed in either the first display device or the second display device. Alternatively, the processor 1120 may include a plurality of processors and may be disposed in the first display device or the second display device. The processor 1120 may perform signal processing and data transmission for control of the first display device or the second display device, by using the signal lines disposed in the hinge module.

The memory 1130 may include a volatile and/or nonvolatile memory. For example, the memory 1130 may store commands or data associated with at least one other element(s) of the electronic device 1101. According to an embodiment, the memory 1130 may store software and/or a program 1140. The program 1140 may include, for example, a kernel 1141, a middleware 1143, an application programming interface (API) 1145, and/or an application program (or "an application") 1147. At least a part of the kernel 1141, the middleware 1143, or the API 1145 may be referred to as an "operating system (OS)".

For example, the kernel 1141 may control or manage system resources (e.g., the bus 1110, the processor 1120, the memory 1130, and the like) that are used to execute operations or functions of other programs (e.g., the middleware 1143, the API 1145, and the application program 1147). Furthermore, the kernel 1141 may provide an interface that allows the middleware 1143, the API 1145, or the application program 1147 to access discrete elements of the electronic device 1101 so as to control or manage system resources.

The middleware 1143 may perform, for example, a mediation role such that the API 1145 or the application program 1147 communicates with the kernel 1141 to exchange data.

Furthermore, the middleware 1143 may process task requests received from the application program 1147 according to a priority. For example, the middleware 1143 may assign the priority, which makes it possible to use a system resource (e.g., the bus 1110, the processor 1120, the memory 1130, or the like) of the electronic device 1101, to at least one of the application program 1147. For example, the middleware 1143 may process the one or more task requests according to the priority assigned to the at least one, which makes it possible to perform scheduling or load balancing on the one or more task requests.

The API 1145 may be, for example, an interface through which the application program 1147 controls a function provided by the kernel 1141 or the middleware 1143, and may include, for example, at least one interface or function (e.g., an instruction) for a file control, a window control, image processing, a character control, or the like. The application 1147 may include, for example, a payment application.

The input/output interface 1150 may play a role, for example, of an interface which transmits a command or data input from a user or another external device, to other element(s) of the electronic device 1101. Furthermore, the input/output interface 1150 may output a command or data, received from other element(s) of the electronic device 1101, to a user or another external device.

The display 1160 may include, for example, a liquid crystal display (LCD), a light-emitting diode (LED) display, an organic LED (OLED) display, a microelectromechanical systems (MEMS) display, or an electronic paper display. The display 1160 may display, for example, various contents (e.g., a text, an image, a video, an icon, a symbol, and the like) to a user. The display 1160 may include a touch screen and may receive, for example, a touch, gesture, proximity, or hovering input using an electronic pen or a part of a user's body. The display 1160 may include a plurality of display modules.

For example, the communication interface 1170 may establish communication between the electronic device 1101 and an external device (e.g., the first external electronic device 1102, the second external electronic device 1104, or the server 1106). For example, the communication interface 1170 may be connected to the network 1162 over wireless communication or wired communication to communicate with the external device (e.g., the second external electronic device 1104 or the server 1106). The communication interface 1170 may be in charge of transmission and reception of the signal associated with the registration of the payment means.

The wireless communication may use at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. Furthermore, the wireless communication may include, for example, the short range communication 1164. The short range communication 1164 may include at least one of wireless fidelity (Wi-Fi), Bluetooth, near field communication (NFC), magnetic security transmission (MST), a global navigation satellite system (GNSS), or the like.

The MST may generate a pulse in response to transmission data using an electromagnetic signal, and the pulse may generate a magnetic field signal. The electronic device 1101 may transfer the magnetic field signal to point of sale (POS), and the POS may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (hereinafter referred to as "Beidou"), or an European global satellite-based navigation system (hereinafter referred to as "Galileo") based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), or the like. The network 1162 may include at least one of telecommunications networks, for example, a computer network (e.g., LAN or WAN), an Internet, or a telephone network.

Each of the first and second electronic devices 1102 and 1104 may be a device of which the type is different from or the same as that of the electronic device 1101. According to an embodiment, the server 1106 may include a group of one or more servers. According to various embodiments, all or a portion of operations that the electronic device 1101 will perform may be executed by another or plural electronic devices (e.g., the electronic device 1102 or 1104 or the server 1106). According to an embodiment, in the case where the electronic device 1101 executes any function or service automatically or in response to a request, the electronic device 1101 may not perform the function or the service internally, but, alternatively additionally, it may request at least a portion of a function associated with the electronic device 1101 from another device (e.g., the electronic device 1102 or 1104 or the server 1106). The other electronic device (e.g., the electronic device 1102 or 1104 or the server 1106) may execute the requested function or additional function and may transmit the execution result to the electronic device 1101. The electronic device 1101 may provide the requested function or service using the received result or may additionally process the received result to provide the requested function or service. To this end, for example, cloud computing, distributed computing, or client-server computing may be used.

At least a part of an apparatus (e.g., modules or functions thereof) or a method (e.g., operations) according to various embodiments may be implemented with instructions stored in a computer-readable storage medium in the form of a programming module. When the instructions are executed by one or more processors (for example, the processor 1120), the one or more processors may perform functions corresponding to the instructions. The computer-readable storage medium may be, for example, a memory included in the memory 1130.

The computer readable recording medium includes hard disk, floppy disk, or magnetic media (e.g., a magnetic tape), optical media (e.g., compact disc read only memory (CD-ROM) or digital versatile disc (DVD)), magneto-optical media (e.g., floptical disk), a hardware device (e.g., ROM, RAM, flash memory, etc.), and so forth. Further, the program instructions include a machine language code created by a complier and a high-level language code executable by a computer using an interpreter. The foregoing hardware device may be configured to be operated as at least one software module to perform an operation of the present disclosure, or vice versa.

Modules or programming modules according to various embodiments of the present disclosure may include one or more of the foregoing elements, have some of the foregoing elements omitted, or further include additional other elements. Operations performed by the modules, the programming modules or other elements according to various embodiments may be executed in a sequential, parallel, repetitive or heuristic manner. Also, some of the operations may be executed in different order or omitted, or may have additional different operations. In addition, the embodiments disclosed herein are presented for the purpose of explanation and understanding of the disclosed technical idea and do not limit the scope of the technical idea described in the present application. Accordingly, the scope of the present application should be interpreted to include all modifications or various other embodiments based on the technical idea of the present application.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. An electronic device comprising:
   a first case and a second case; and
   a hinge module disposed to connect the first case and the second case to allow the first and second cases to rotate,
   wherein the hinge module includes:
   a first case connection connected to the first case;
   a second case connection connected to the second case;
   a first hinge shaft having one end connected to the first case connection;
   a second hinge shaft having one end connected to the second case connection; and
   a curling part, including a first curling part and a second curling part, disposed to provide a frictional force to the first hinge shaft, at least a portion of which is inserted into the first curling part, to allow the first hinge shaft to rotate with a first torque and to provide a frictional force to the second hinge shaft, at least a portion of which is inserted into the second curling part, to allow the second hinge shaft to rotate with a second torque different from the first torque.

2. The electronic device of claim 1, further comprising:
   a stopping member disposed to limit a rotation range of the first hinge shaft and the second hinge shaft that are inserted into the stopping member,
   wherein the stopping member includes:
   a first stopper allowing a first case stopping member formed on the first case connection to rotate in a first angle range;
   a second stopper allowing a second case stopping member formed on the second case connection to rotate in a second angle range; and
   a stopping member body on which the first stopper and the second stopper are disposed.

3. The electronic device of claim 1, wherein at least one of a diameter of the first hinge shaft and a shape of a surface of the first hinge shaft inserted into the first curling part is different from at least one of a diameter of the second hinge shaft and a shape of a surface of the second hinge shaft inserted into the second curling part, and
   wherein at least one of a diameter of a first curling hole of the first curling part into which the first hinge shaft is inserted and a shape of an inner wall that forms the first curling hole is different from at least one of a diameter of a second curling hole of the second curling part into which the second hinge shaft is inserted and a shape of an inner wall that forms the second curling hole.

4. The electronic device of claim 1, wherein the first hinge shaft has a first diameter larger than a diameter of a first curling hole formed in the first curling part, and
   wherein the second hinge shaft has a second diameter larger than the first diameter.

5. The electronic device of claim 1, wherein the first hinge shaft includes a first rotary friction part mounted in the first curling part and including a strap-shaped protrusion with a first width, and
   wherein the second hinge shaft includes a second rotary friction part mounted in the second curling part and including a strap-shaped protrusion with a second width different from the first width.

6. The electronic device of claim 5, wherein a number of strap-shaped protrusions with the second width on the second rotary friction part is the same as, or different from, a number of strap-shaped protrusions with the first width on the first rotary friction part.

7. The electronic device of claim 1, wherein the first hinge shaft includes a first rotary friction part mounted in the first curling part and including a rail groove with a first width that is formed in an axial direction of the first hinge shaft, and
   wherein the second hinge shaft includes a second rotary friction part mounted in the second curling part and including a rail groove with a second width different from the first width.

8. The electronic device of claim 7, wherein a number of rail grooves with the second width on the second rotary friction part is the same as, or different from, a number of rail grooves with the first width on the first rotary friction part.

9. The electronic device of claim 1, wherein the first hinge shaft includes a first rotary friction part mounted in the first curling part and having at least one first grid protrusion formed by at least one lateral strap-shaped groove and at least one longitudinal rail groove, and
   wherein the second hinge shaft includes a second rotary friction part mounted in the second curling part and having at least one second grid protrusion formed by at least one lateral strap-shaped groove and at least one longitudinal rail groove and having a different shape from the first grid protrusion.

10. The electronic device of claim 1, wherein:
    the first curling part includes a first curling hole in which a first diameter is formed;

the second curling part includes a second curling hole in which a second diameter different from the first diameter is formed; and a curling part body disposed to connect the first curling part and the second curling part, the curling part body having an empty area in the center.

11. The electronic device of claim 1, wherein:

the first curling part into which the first hinge shaft is inserted and that has a first number of strap-shaped grooves with a first width on an inner wall of the first curling part;

the second curling part into which the second hinge shaft is inserted and that has a second number of strap-shaped grooves with a second width on an inner wall of the second curling part; and a curling part body disposed to connect the first curling part and the second curling part.

12. The electronic device of claim 1, wherein:

the first curling part into which the first hinge shaft is inserted and that has a first number of rail grooves with a first width that are formed on an inner wall of the first curling part in a longitudinal direction;

the second curling part into which the second hinge shaft is inserted and that has a second number of rail grooves with a second width; and a curling part body disposed to connect the first curling part and the second curling part.

13. The electronic device of claim 1, wherein:

the first curling part into which the first hinge shaft is inserted and that includes, on an inner wall, a first number of longitudinal rail grooves with a first width and a second number of lateral strap-shaped grooves with a second width;

the second curling part into which the second hinge shaft is inserted and that includes, on an inner wall, a third number of longitudinal rail grooves with a third width and a fourth number of lateral strap-shaped grooves with a fourth width; and a curling part body disposed to connect the first curling part and the second curling part.

14. The electronic device of claim 1, wherein the electronic device further comprises at least one of:

a shaft fixing part disposed to fix an axial movement of the first hinge shaft and the second hinge shaft;

a hinge dummy to which the hinge module is fixed; and a hinge cover disposed to cover the hinge dummy to which the hinge module is fixed.

15. The electronic device of claim 1, further comprising:

at least one display device mounted on at least one of the first case and the second case.

16. The electronic device of claim 1, wherein:

the first curling part into which the first hinge shaft with a first diameter is inserted and in which a first curling hole with a specified diameter is formed;

the second curling part into which the second hinge shaft with a second diameter different from the first diameter is inserted and in which a second curling hole with the specified diameter is formed; and a curling part body disposed to connect the first curling part and the second curling part.

17. The electronic device of claim 1, the first curling part into which the first hinge shaft is inserted and in which a first curling hole with a first diameter is formed;

the second curling part into which the second hinge shaft with the same diameter as the first hinge shaft is inserted and in which a second curling hole with a second diameter different from the first diameter is formed; and a curling part body disposed to connect the first curling part and the second curling part.

* * * * *